(12) United States Patent
Iba

(10) Patent No.: US 7,772,112 B2
(45) Date of Patent: Aug. 10, 2010

(54) METHOD OF MANUFACTURING A SEMICONDUCTOR DEVICE

(75) Inventor: Yoshihisa Iba, Shinjuku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/649,821

(22) Filed: Dec. 30, 2009

(65) Prior Publication Data

US 2010/0173491 A1 Jul. 8, 2010

(30) Foreign Application Priority Data

Jan. 7, 2009 (JP) .............................. 2009-001841

(51) Int. Cl.
*H01L 21/4763* (2006.01)

(52) U.S. Cl. ............... 438/637; 438/631; 257/E21.257; 257/E21.579

(58) Field of Classification Search .................. 438/631, 438/637
See application file for complete search history.

(56) References Cited

U.S. PATENT DOCUMENTS

| 6,376,366 | B1 * | 4/2002 | Lin et al. .................. 438/637 |
| 6,383,907 | B1 | 5/2002 | Hasegawa et al. |
| 7,064,059 | B2 * | 6/2006 | Kim et al. .................. 438/637 |
| 7,214,609 | B2 * | 5/2007 | Jiang et al. .................. 438/637 |
| 2004/0198037 | A1 | 10/2004 | Iba |
| 2006/0040501 | A1 * | 2/2006 | America et al. ............. 438/706 |
| 2007/0018330 | A1 * | 1/2007 | Takeda et al. ............... 257/762 |
| 2007/0212877 | A1 * | 9/2007 | Ho et al. .................... 438/637 |
| 2009/0121353 | A1 * | 5/2009 | Ramappa et al. ............. 257/751 |

FOREIGN PATENT DOCUMENTS

| JP | 2001-077196 A | 3/2001 |
| JP | 2002-222860 A | 8/2002 |
| JP | 3757213 B2 | 3/2006 |
| JP | 2008-047582 A | 2/2008 |

* cited by examiner

*Primary Examiner*—Alexander G Ghyka
(74) *Attorney, Agent, or Firm*—Westerman, Hattori, Daniels & Adrian, LLP

(57) ABSTRACT

A method of forming an insulating layer on an conductive layer; forming a first mask layer and a second mask layer on the insulating layer; forming a resist layer on the second mask layer; patterning the resist layer; patterning the second mask layer by using the resist layer as a mask; etching the first mask layer halfway through its thickness by using the resist layer and the second mask layer as a mask; removing the resist layer; etching a remaining portion of the first mask layer using the second mask layer as a mask; forming an interconnect groove by etching the insulating layer using the first mask layer as a mask; and forming an electrically conductive material into the interconnect groove, thereby forming an interconnect layer connected to the conductive layer.

13 Claims, 17 Drawing Sheets

METHOD OF MANUFACTURING A SEMICONDUCTOR DEVICE

CROSS-REFERENCE TO RELATED APPLICATION

This application is based upon and claims the benefit of priority of the prior Japanese Patent Application No. 2009-001841, filed on Jan. 7, 2009, the entire contents of which are incorporated herein by reference.

FIELD

The embodiments discussed herein are related to a method of manufacturing a semiconductor device, and more particularly to an a method of manufacturing a semiconductor device that uses a damascene process.

BACKGROUND

Work on the miniaturization of process technology has been proceeding in order to further increase the packing density of semiconductor devices. As the feature sizes of semiconductor devices decrease, interconnect structures for connecting the devices to each other have also been decreasing in size.

Furthermore, for semiconductor devices, not only the need for higher packing density but also the need for lower power consumption, higher operating speed, etc., has been increasing, necessitating a reduction in the dielectric constant of inter-metal insulating layers.

As a technique for forming an interconnect structure to meet such needs, a damascene process is widely used which forms an embedded interconnect by embedding an electrical conductive material into a trench formed from a low dielectric constant material and removing excess conductive material by chemical mechanical polishing. In particular, a dual damascene process which simultaneously forms a via and an embedded interconnect has been attracting attention from the standpoint of simplifying the fabrication process.

FIGS. 1A to 1I illustrate one example of a related art fabrication process for forming an interconnect line by using a dual damascene process.

First, as depicted in FIG. 1A, a barrier layer 124, a first insulating layer 130, and a second insulating layer 131 are formed one on top of another on an interconnect layer 125 formed in a multilayer structure fabricated by stacking an insulating layer 122 and a silicon carbide layer 123. Further, a first hard mask layer 132 of silicon oxide is formed on top of the second insulating layer 131, and a second hard mask layer 133 of silicon nitride is formed on top of the first hard mask layer 132.

Subsequently, a via 135 is formed in a region above the interconnect layer 125 by passing through the second hard mask layer 133, the first hard mask layer 132, the second insulating layer 131, and the first insulating layer 130.

Next, as depicted in FIG. 1B, a first resist layer 140 is formed in such a manner as to fill the via 135 and to cover the second hard mask layer 133.

Next, as depicted in FIG. 1C, the first resist layer 140 is etched back until the second hard mask layer 133 is exposed, and the upper surface of the first resist layer 140 is planarized so that it becomes coplanar with the upper surface of the second hard mask layer 133.

Next, as depicted in FIG. 1D, a BARC (Bottom Anti-Reflective Coating) layer 141 and a second resist layer 142 are formed on top of the second hard mask layer 133. Subsequently, an opening 150 for forming an interconnect groove is formed by patterning the second resist layer 142 in such a manner to be aligned with the via 135.

Next, as depicted in FIG. 1E, using the patterned second resist layer 142 as a mask, the BARC layer 141 and the second hard mask layer 133 are etched until the first mask layer 132 is exposed, and the second hard mask layer 133 is thus patterned.

Next, as depicted in FIG. 1F, the second resist layer 142, the BARC layer 141, and the first resist layer 140 embedded in the via 135 are removed by asking.

Next, as depicted in FIG. 1G, using the patterned second hard mask layer 133 as a mask, the first hard mask layer 132 is etched, and the first hard mask layer 132 is thus patterned.

Next, as depicted in FIG. 1H, using the second hard mask layer 133 and first hard mask layer 132 as a mask, the second insulating layer 131 is etched until the first insulating layer 130 is exposed, and an interconnect groove 136 is formed in the second insulating layer 131. With this etching, not only is the second hard mask layer 133 removed, but also the thickness of the first hard mask layer 132 is reduced by etching. Further, with this etching, the portion of the barrier layer 124 that is exposed in the via 135 is removed, and the interconnect layer 125 is exposed in the via 135.

Finally, as depicted in FIG. 1I, an electrically conductive material 137 is embedded into the via 135 and the interconnect groove 136, thus forming an embedded interconnect layer 138 in the second insulating layer 131.

Another example of a related art fabrication process for forming an interconnect line by using the dual damascene process will be described with reference to FIGS. 2A and 2B.

First, the structure depicted in FIG. 1E is formed by performing the same processing as described above.

Next, as depicted in FIG. 2A, using the second resist layer 142 as a mask, the first hard mask layer 132 is etched to form a pattern in the first hard mask layer 132. The first and second resist layers 140 and 142 are not yet removed by ashing.

Next, as depicted in FIG. 2B, the first resist layer 140, the second resist layer 142, and the BARC layer 141 are removed by ashing, after which the interconnect is formed by performing the same fabrication steps as those depicted in FIGS. 1G to 1I.

In the interconnect formation method illustrated in FIGS. 1A to 1I, provision has to be made so that the second hard mask layer 133 acting as a mask will not be etched away when etching the first hard mask layer 132 in the step of FIG. 1G. For this purpose, it is necessary to use an etching gas that etches the first hard mask layer 132 at a greater rate than the second hard mask layer 133. Since the etching gas needs to have etching selectivity, such that the etching rate is greater for the first hard mask layer 132 than for the second hard mask layer 133, the types of etching gases that can be used are limited. This limits the freedom in the process.

On the other hand, in the interconnect formation method illustrated in FIGS. 2A and 2B, since the first hard mask layer 132 is etched while leaving the second resist layer 142 on the second hard mask layer 133, the second hard mask layer 133 can be prevented from being etched. However, since the first hard mask layer 132 is etched while leaving the first resist layer 140 unremoved, deposits containing etching by-products may accumulate on the sidewalls of the first resist layer 140 and may be left as fences 160 after removing the first resist layer 140, as depicted in FIGS. 2A and 2B.

Japanese Laid-open Patent Publication No. 2001-77196
Japanese Laid-open Patent Publication No. 2002-222860
Japanese Patent No. 3757213
Japanese Laid-open Patent Publication No. 2008-47582

SUMMARY

According to an aspect of the embodiment, a method of manufacturing a semiconductor device includes forming an insulating layer over an electrically conductive layer; forming a first mask layer over the insulating layer; forming a second mask layer over the first mask layer; forming a via which passes through the second mask layer, the first mask layer, and the insulating layer; forming a first resist layer in such a manner as to fill the via; forming a second resist layer over the second mask layer and the first resist layer; patterning the second resist layer into an interconnect pattern; etching the second mask layer by using the patterned second resist layer as a mask; etching the first mask layer halfway through a thickness thereof by using the second resist layer and the second mask layer as a mask; removing the first resist layer and the second resist layer; etching away a remaining portion of the first mask layer by using the second mask layer as a mask; forming an interconnect groove by etching the insulating layer using the first mask layer as a mask; and forming an electrically conductive material into the via and the interconnect groove, thereby forming an interconnect layer connected to the electrically conductive layer.

The object and advantages of the embodiments will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of an interconnect formation method disclosed herein will be described below with reference to the drawings. It will, however, be noted that the technical scope of the present invention is not limited to the specific embodiments described herein, but extends to the inventions described in the appended claims and their equivalents.

[a] First Embodiment

Figure 3:
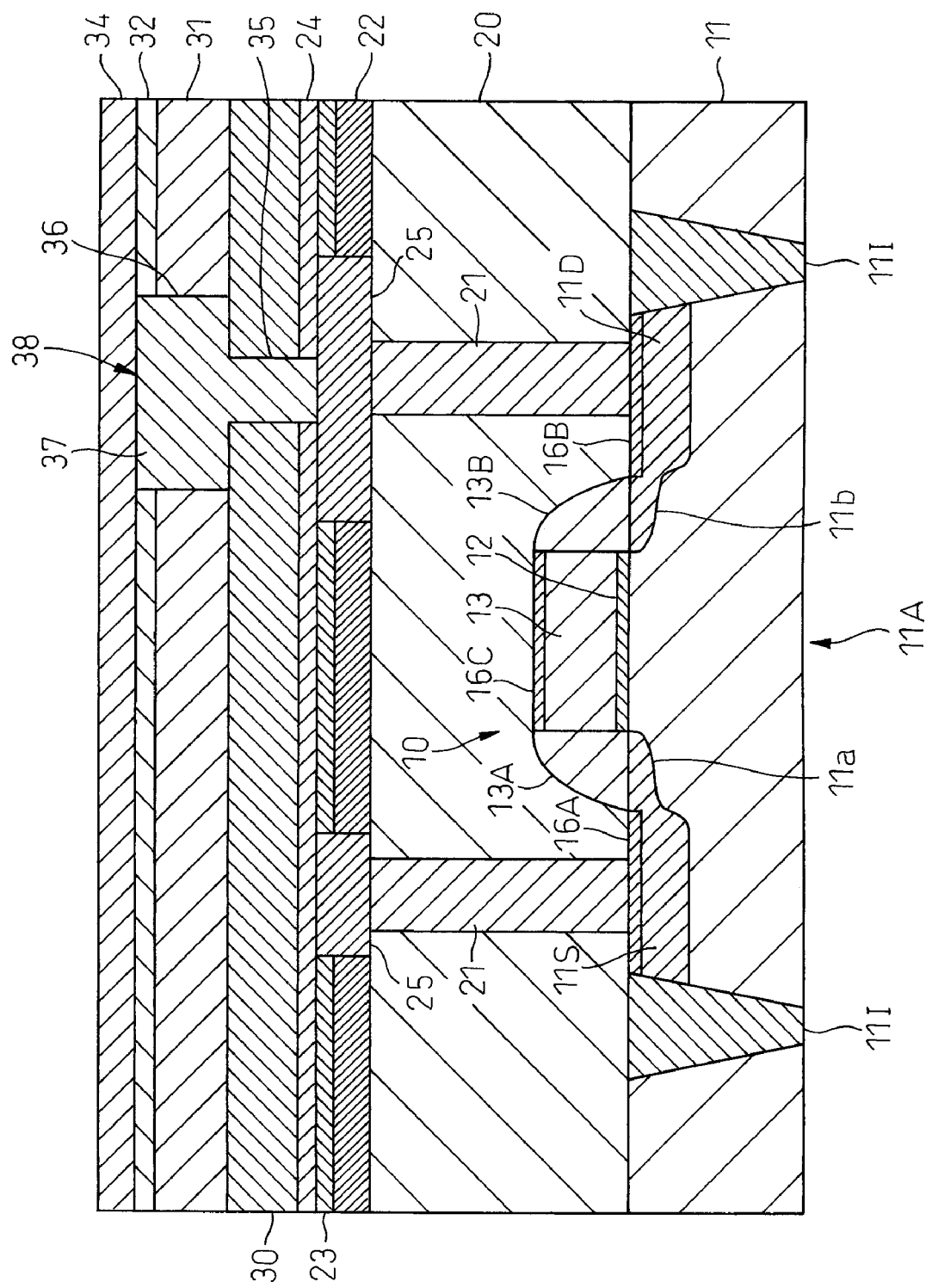
FIG. 3 is a diagram illustrating the structure of a semiconductor device fabricated in accordance with a first embodiment of an interconnect formation method disclosed herein.

FIG. 3 is a diagram illustrating one example of the structure of a semiconductor device fabricated in accordance with a first embodiment of an interconnect formation method disclosed herein.

As depicted in FIG. 3, a device region 11A, which is an n-type well isolated by an STI-type (Shallow Trench Isolation) device isolation structure 11I, is formed in a single-crystalline substrate 11. Then, a p-channel MOS transistor 10 is formed within this device region 11A.

A gate insulating film 12 is formed on the silicon substrate 11 at a position above a channel region formed in the device region 11A. The gate insulating film 12 is formed, for example, from a silicon oxide film or a silicon oxide-nitride film.

A gate electrode 13 of p-type doped polycrystalline silicon is formed on the gate insulating film 12. Sidewall insulating films 13A and 13B are formed on the respective sidewalls of the gate electrode 13.

In the silicon substrate 11, p-type source/drain regions 11S and 11D are formed outwardly of the respective sidewall insulating films 13A and 13B.

As depicted in FIG. 3, the p-channel MOS transistor 10 further includes a p-type source extension region 11a and drain extension region 11b respectively formed in regions adjacent to both sides of a region underneath the gate electrode 13.

The p-type source extension region 11a extends from the region underneath the gate electrode 13 toward the p-type source region 11S, and is connected to the p-type source region 11S. Similarly, the drain extension region 11b extends from the region underneath the gate electrode 13 toward the p-type drain region 11D, and is connected to the p-type drain region 11D.

Further, as depicted in FIG. 3, silicide layers 16A and 16B are formed on the p-type source/drain regions 11S and 11D, respectively. A similar silicide layer 16C is also formed on the gate electrode 13.

A first insulating layer 20 is formed over the silicon substrate 11 so as to bury the transistor 10. A first interconnect layer 25 as an electrically conductive layer is formed on the first insulating layer 20. This first interconnect layer 25 is formed in a second insulating layer 22.

Tungsten plugs (W plugs) 21 for connecting the first interconnect layer 25 to the silicide layers 16A and 16B of the transistor 10 are embedded in the first insulating layer 20.

A silicon carbide layer 23 is formed on the second insulating layer 22. This silicon carbide layer 23 is covered by a first barrier layer 24 which is formed, for example, from a silicon carbide layer.

A third insulating layer 30 is formed on the first barrier layer 24, and a fourth insulating layer 31 is formed on the third insulating layer 30; then, a first hard mask layer 32 is formed on the fourth insulating layer 31.

A via 35 is formed by passing through the third insulating layer 30 and the first barrier layer 24. Further, an interconnect groove 36 is formed in the fourth insulating layer 31 and first hard mask layer 32 in such a manner as to be aligned with the via 35. An electrically conductive material 37 is embedded into the interconnect groove 36 and the via 35, thus forming an embedded interconnect layer 38 as a second interconnect layer in the fourth insulating layer 31.

The third insulating layer 30 and the fourth insulating layer 31 are each formed from a low-k (low dielectric constant) material. The fourth insulating layer 31, in which the embedded interconnect layer 38 is formed, is preferably formed from a particularly low dielectric constant material in order to reduce capacitance between it and its adjacent interconnect lines not shown. In the present embodiment, the third insulating layer 30 and the fourth insulating layer 31 are each formed from an inorganic material. For the fourth insulating layer 31, it is preferable to use a material, such as porous silica, that has a lower dielectric constant than the third insulating layer. The first hard mask layer 32 is used as a mask when forming the interconnect groove 36 in the fourth insulating layer 31, but a predetermined thickness of the first hard mask layer 32 is left on the fourth insulating layer 31 in order to provide good electrical characteristics to the embedded interconnect layer 38. However, the first hard mask layer 32 may be removed if it does not affect the electrical characteristics of the embedded interconnect layer 38.

The first interconnect layer 25 is connected to the conductive material 37 embedded in the via 35. The p-type drain region 11D is connected to the embedded interconnect layer 38 via the W plug 21, the first interconnect layer 25, and the conductive material 37 embedded in the via 35.

A second barrier layer 34 is formed on the first hard mask layer 32. Other interconnect layers, etc. may be formed as needed on the second barrier layer 34.

Next, referring to FIGS. 4A to 5, the first embodiment of the interconnect formation method disclosed herein will be described below for the semiconductor device having the interconnect structure depicted in FIG. 3.

Figure 4A:
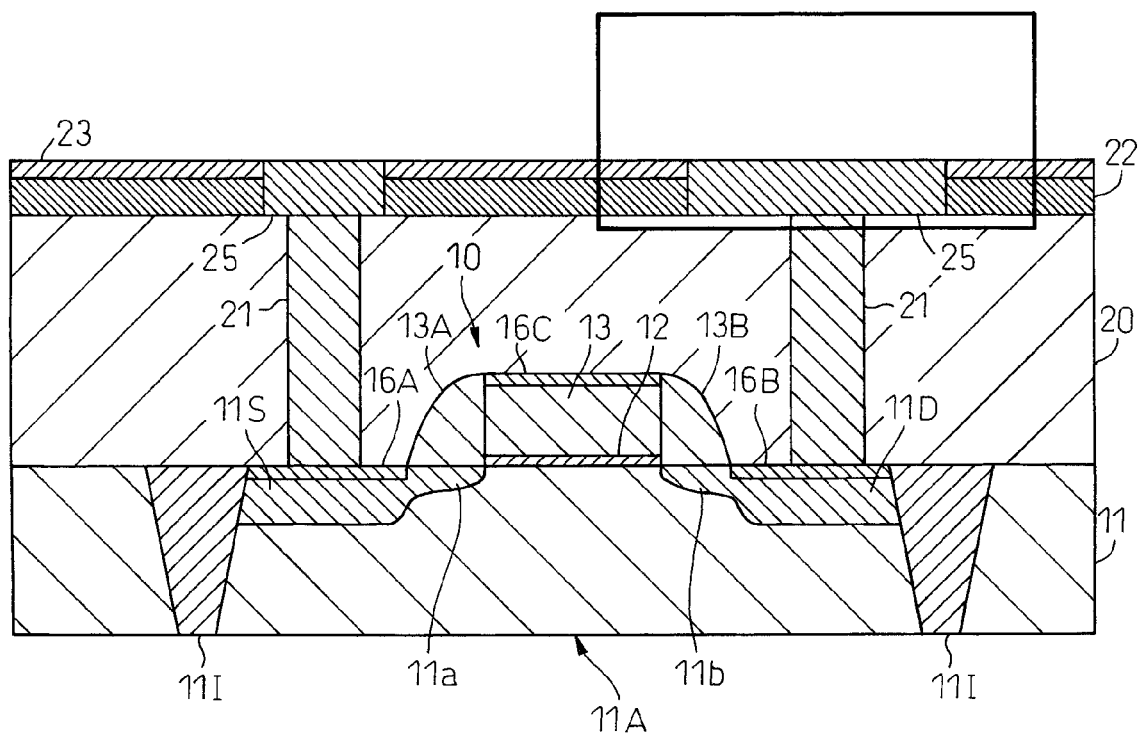
FIGS. 4A to 4N are diagrams depicting fabrication steps according to the first embodiment of the interconnect formation method disclosed herein.

First, as depicted in FIG. 4A, the structure containing the transistor 10 is formed on the silicon substrate 11. The structure depicted in FIG. 4A further includes the first insulating layer 20, the W plugs 21, the second insulating layer 22, the silicon carbide layer 23, and the first interconnect layer 25. The process for forming an interconnect line in the region enclosed by a rectangular frame in the figure will be described below.

Figure 4B:
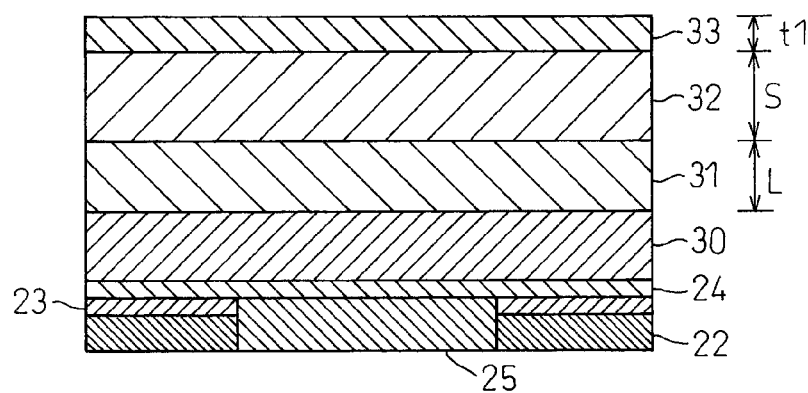

Next, as depicted in FIG. 4B, the first barrier layer 24, the third insulating layer 30, and the fourth insulating layer 31 are formed in sequence one on top of another by plasma CVD on the first interconnect layer 25 which is a conductive layer. Subsequently, the first hard mask layer 32 is formed on the fourth insulating layer 31 by plasma CVD, and the second hard mask layer 33 is formed on the first hard mask layer 32 by plasma CVD.

Preferably, the third insulating layer 30 and the fourth insulating layer 31 are each formed from a low-k material. More specifically, silicon oxide-carbide (SiOC) or porous silica or the like can be used as the low-k material. For the fourth insulating layer 31, it is preferable to use a material having a lower dielectric constant than the material used to form the third insulating layer 30.

For the first hard mask layer 32, it is preferable to use a material that is not etched during the etching of a resist material formed from a resin but can act as a mask when patterning the fourth insulating layer 31. Further, the material used to form the first hard mask layer 32 is preferably a material that can be easily polished by chemical mechanical polishing.

For second hard mask layer 33 also, it is preferable to use a material that is not etched during the etching of a resist material formed from a resin but can act as a mask when patterning the first hard mask layer 32.

Further, it is preferable that when etching the first hard mask layer 32 by using the second hard mask layer 33 as a mask, the first hard mask layer 32 is etched at a greater rate than the second hard mask layer 33. The reason is that, even after the first hard mask layer 32 has been etched and patterned, a predetermined thickness of the second hard mask layer 33 needs to be left on the first hard mask layer 32 in order to ensure the formation of an interconnect groove having a good geometrical accuracy in the fourth insulating layer 31. In this specification, the ratio of the etching rate of the first hard mask layer 32 to the etching rate of the second hard mask layer 33 is defined as the etching selectivity. A high etching selectivity means that the etching rate of the first hard mask layer 32 is greater than the etching rate of the second hard mask layer 33. A low etching selectivity means that the etching rate of the first hard mask layer 32 is equal to or smaller than the etching rate of the second hard mask layer 33.

In view of the above, when using a gas containing $CF_4$, it is preferable to form the first hard mask layer 32 from silicon oxide ($SiO_2$) and form the second hard mask layer 33 from silicon nitride (SiN) or silicon carbide (SiC).

As for the thicknesses of the above layers, the thickness of the first barrier layer 24 may be 30 nm, and the thickness of the third insulating layer 30 and the thickness L of the fourth insulating layer 31, when combined, may be 250 nm. The ratio of the thickness of the third insulating layer 30 to the thickness of the fourth insulating layer 31 can be suitably adjusted in accordance with the depth of the interconnect groove needed. The thicknesses of the first and second hard mask layers 32 and 33 will be described later.

Figure 4C:
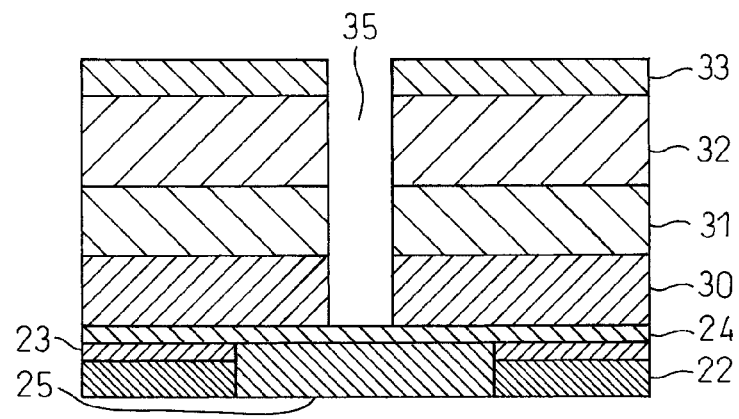

Next, as depicted in FIG. 4C, the via 35 is formed in the region above the first interconnect layer 25 by etching through the second hard mask layer 33, the first hard mask layer 32, the fourth insulating layer 31, and the third insulating layer 30. The first barrier layer 24 is exposed in the bottom of the via 35.

Figure 4D:
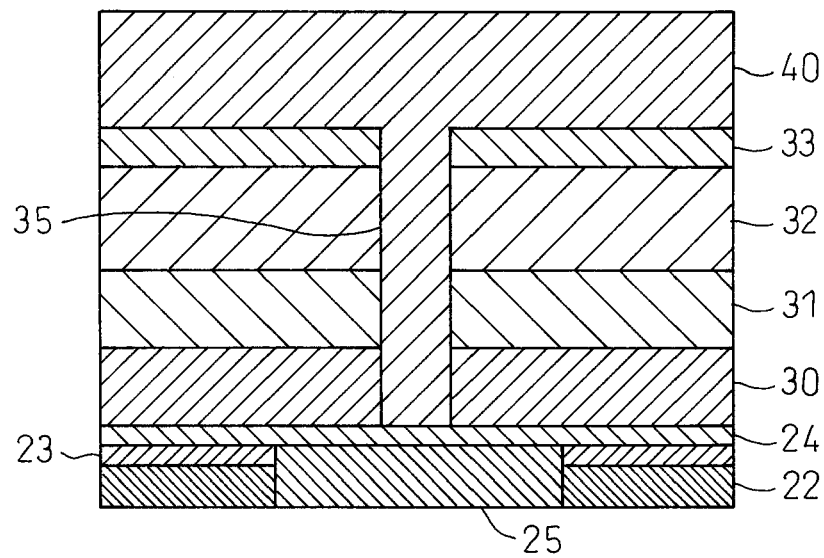

Next, as depicted in FIG. 4D, a first resist layer 40 is formed in such a manner as to fill the via 35 and to cover the second hard mask layer 33.

Figure 4E:
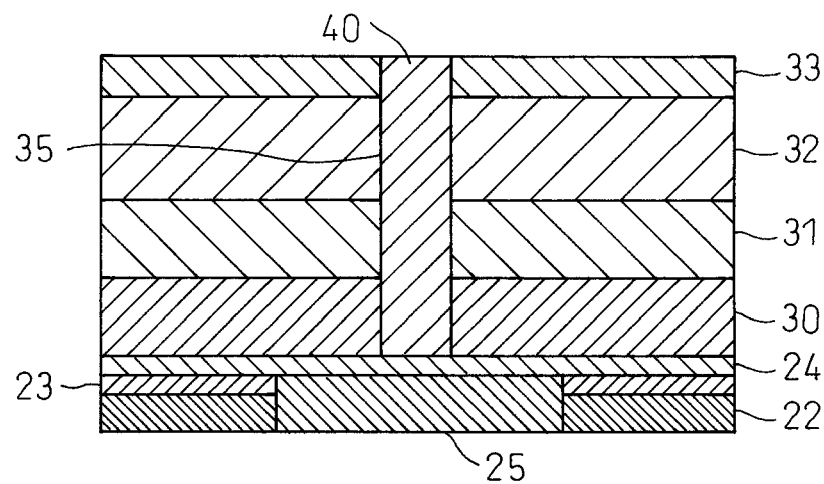

Next, as depicted in FIG. 4E, the first resist layer 40 is etched back until the second hard mask layer 33 is exposed.

Figure 4F:
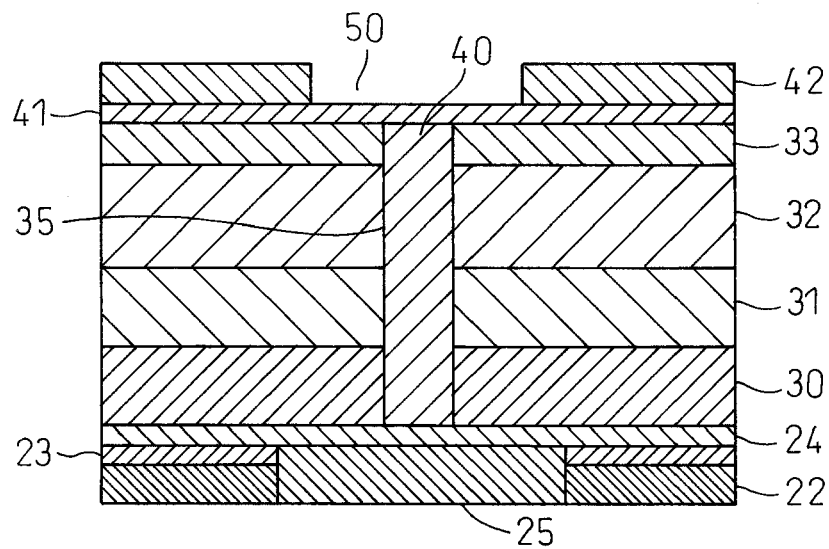

Next, as depicted in FIG. 4F, a BARC layer 41 and a second resist layer 42 are formed on top of the second hard mask layer 33. Subsequently, an opening 50 for forming an interconnect groove is formed by patterning the second resist layer 42 in such a manner to be aligned with the via 35. The patterned second resist layer 42 contains an interconnect pattern that matches the embedded interconnect layer 38.

Figure 4G:
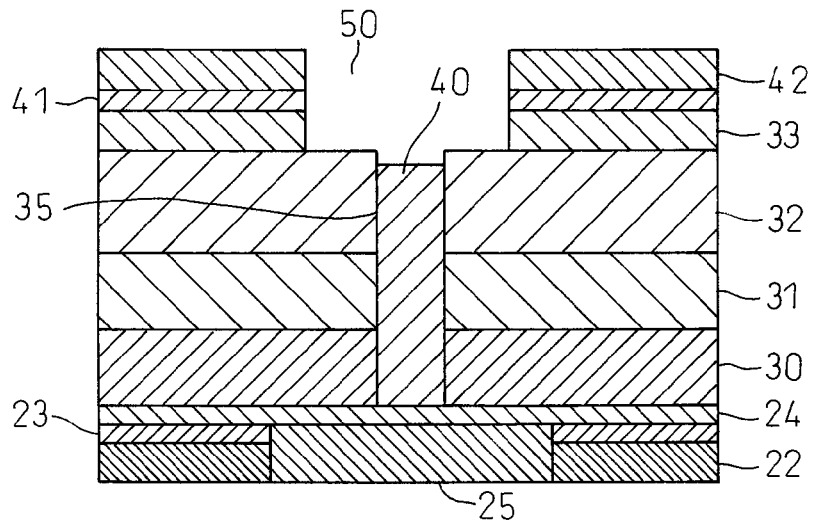

Next, as depicted in FIG. 4G, using the patterned second resist layer 42 as a mask, the BARC layer 41 is etched. The BARC layer 41 is etched by means of plasma etching using, for example, a gas containing $CF_4$.

Subsequently, using the patterned second resist layer 42 and BARC layer 41 as a mask, the second hard mask layer 33 is etched until the first hard mask layer 32 is exposed, thus patterning the second hard mask layer 33. The second hard mask layer 33 is etched by means of plasma etching using, for example, a gas containing $CH_2F_2/O_2/Ar$. At this time, a portion of the first resist layer 40 embedded in the via 35 is also removed.

Figure 4H:
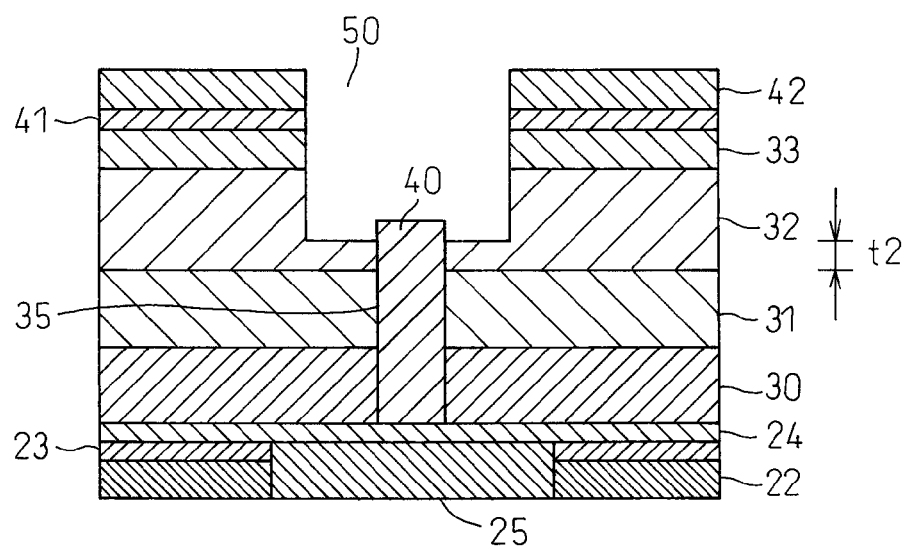

Next, as depicted in FIG. 4H, using the patterned second resist layer 42, BARC layer 41, and second hard mask layer 33 as a mask, the first hard mask layer 32 is etched halfway through its thickness. The first hard mask layer 32 is etched halfway through its thickness by means of plasma etching using, for example, a gas containing $CF_4$. In the example depicted in FIG. 4H, the first hard mask layer 32 is etched until the thickness of the portion exposed in the opening 50 is reduced to t2.

Since the second hard mask layer 33 is covered by the second resist layer 42 and the BARC layer 41, its thickness is not reduced when the first hard mask layer 32 is etched halfway through its thickness. That is, the second hard mask layer 33 retains its thickness t1 as formed in the step of FIG. 4B.

From the standpoint of enhancing the geometrical accuracy of the pattern, it is preferable to plasma etch the first hard mask layer 32 by using a gas containing $CF_4$ and at least one kind of gas selected from the group consisting of $C_4F_6$, $C_4F_8$, $CHF_3$, $CH_2F_2$, $H_2$, $N_2$, $O_2$, and Ar.

More specifically, in the step of FIG. 4H, $CF_4$ and $CHF_3$ can be used by setting the $CF_4$ gas flow rate to $3.38 \times 10^{-2}$ Pa·m$^3$/second (200 sccm) and the $CHF_3$ gas flow rate to $8.45 \times 10^{-3}$ to $1.69 \times 10^{-2}$ Pa·m$^3$/second (50 to 100 sccm). The plasma etching can be carried out using a processing pressure of 3.99 to 13.3 Pa (30 to 100 mTorr). Further, in the plasma etching, the plasma is generated using, for example, a power of 500 W.

In the step of FIG. 4H, it is preferable to etch the first hard mask layer 32 until the thickness t2 of the portion exposed in the opening 50 is reduced to within the range of 30 to 60 nm. It is preferable to set the thickness t2 equal to or greater than 30 nm from the standpoint of preventing the underlying fourth insulating layer 31 from being damaged by etching or ashing. On the other hand, from the standpoint of removing the remaining portion of the first hard mask layer 32 by etching in a subsequent step, it is preferable to set the thickness t2 not greater than 60 nm.

In connection with the fact that the thickness t2 is reduced to within the range of 30 to 60 nm in the step of FIG. 4H, it is preferable that the thickness t1 of the second hard mask layer 33 to be formed in the step of FIG. 4B is chosen to lie within the range of 23 to 90 nm. The reason for this will be described later.

Since the first hard mask layer 32 is etched only halfway through its thickness in the step of FIG. 4H, the amount of the first resist layer 40 protruding into the opening 50 is small, as depicted in FIG. 4H.

Figure 4I:
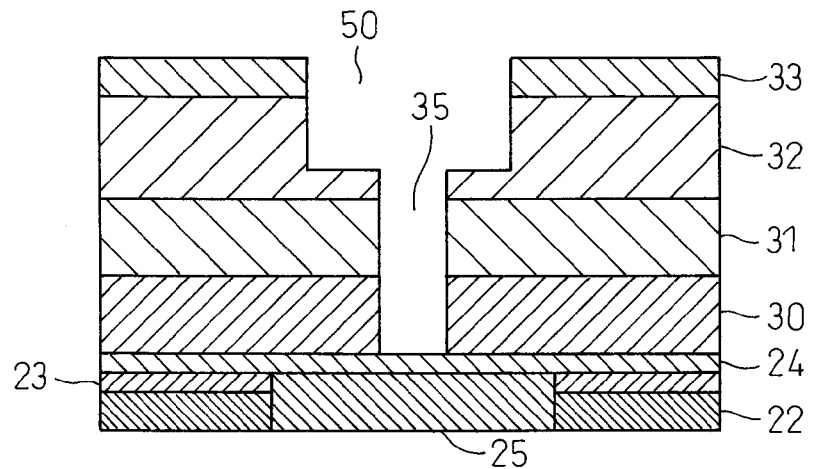

Next, as depicted in FIG. 4I, the second resist layer 42, the BARC layer 41, and the first resist layer 40 embedded in the via 35 are removed by ashing.

Since the first resist layer 40 protruding by a small amount into the opening 50 is removed by ashing in the step of FIG. 4I, it is possible to prevent fences from being formed inside the opening 50.

Figure 4J:
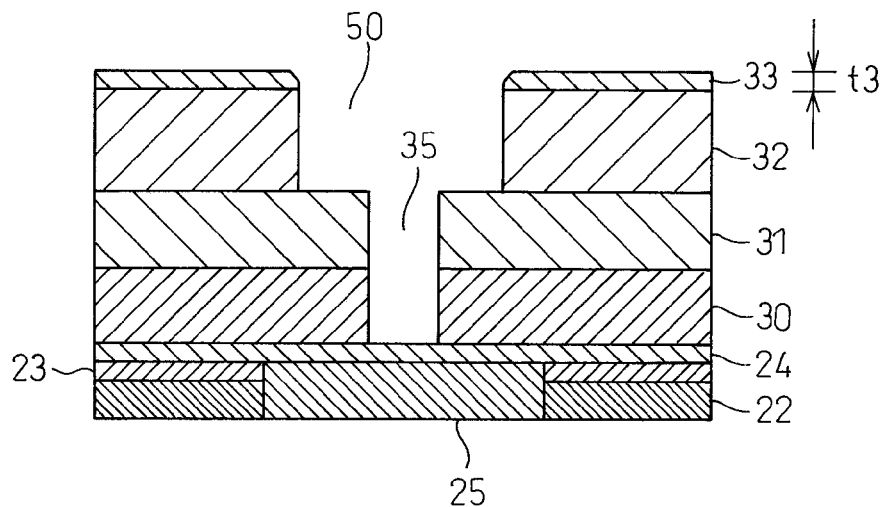

Next, as depicted in FIG. 4J, using the patterned second hard mask layer 33 as a mask, the first hard mask layer 32 is etched to remove all of the remaining portion of thickness t2, thus patterning the first hard mask layer 32. The remaining t2-thickness portion of the first hard mask layer 32 is etched away by means of plasma etching using, for example, a gas containing $CF_4$ having low etching selectivity. Further, in the example depicted in FIG. 4J, the second hard mask layer 33 is etched until the thickness of its thickest portion is reduced from t1 to t3.

From the standpoint of enhancing the geometrical accuracy of the pattern, it is preferable to plasma etch the remaining t2-thickness portion of the first hard mask layer 32 by using a gas containing $CF_4$ and at least one kind of gas selected from the group consisting of $C_4F_6$, $C_4F_8$, $CHF_3$, $CH_2F_2$, $H_2$, $N_2$, $O_2$, and Ar. Alternatively, the plasma etching of the remaining t2-thickness portion of the first hard mask layer 32 may be carried out using a gas that does not contain $CF_4$.

Further, it is preferable to perform the plasma etching of the remaining t2-thickness portion of the first hard mask layer 32 by using a gas containing $CF_4$ and CO, because etching selectivity can then be obtained such that the etching rate of the first hard mask layer 32 is greater than the etching rate of the second hard mask layer 33. The reason for this will be given later.

In the step of FIG. 4J, the plasma etching can be performed using the above etching gas and using a processing pressure of 6.65 to 13.3 Pa (50 to 100 mTorr). Further, in the plasma etching, the plasma is generated using, for example, a power of 300 W.

Further, in the step of FIG. 4J, it is preferable that the thickness t3 of the second hard mask layer 33, the initial thickness t1 of the second hard mask layer 33 (see FIG. 4B), and the remaining thickness t2 of the first hard mask layer 32 (see FIG. 4H) satisfy the following relationship (1). The relationship (1) will be described in detail later.

$$t1/2 - t3/2 < t2 < t1 - t3 \qquad (1)$$

Figure 4K:
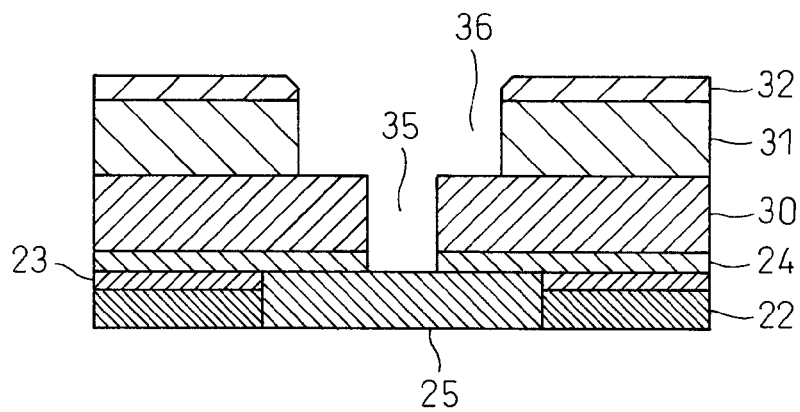

Next, as depicted in FIG. 4K, using the patterned second hard mask layer 33 and first hard mask layer 32 as a mask, the fourth insulating layer 31 is etched until the third insulating layer 30 is exposed, thus forming the interconnect groove 36. The fourth insulating layer 31 is etched by means of plasma etching using, for example, a gas containing $CF_4$. With this etching, the portion of the first barrier layer 24 that is exposed in the via 35 is removed, and the first interconnect layer 25 is exposed in the via 35. Then, after wet cleaning the interconnect structure depicted in FIG. 4K, a barrier metal layer and seed layer (not shown) are formed on the inner walls of the via 35 and interconnect groove 36. The seed layer can be formed using, for example, copper.

In the step of FIG. 4K, when the first hard mask layer 32 is formed from silicon oxide, and the fourth insulating layer 31 from a low-k material, if a gas containing $CF_4$ is used for etching the fourth insulating layer 31, the two layers can be etched at equal rates.

Accordingly, considering the fact that the fourth insulating layer 31 is etched using the first hard mask layer 32 as a mask, it is preferable that the initial thickness S of the first hard mask layer 32 (see FIG. 4B) is made larger than the thickness L of the fourth insulating layer 31. By making the thickness S larger than the thickness L, a predetermined thickness of the first hard mask layer 32 remains on the fourth insulating layer 31 even after etching the fourth insulating layer 31.

The first hard mask layer 32 is reduced in thickness with its edge shoulder portions near the opening 50 eroded by etching, as depicted in FIG. 4K. Considering the erosion of the shoulder portions, it is preferable that the thickest portion of the first hard mask layer 32 retains a thickness of at least 30 nm after the etching, because the interconnect groove can then be formed with good geometrical accuracy in the fourth insulating layer 31 by etching it using the first hard mask layer 32 as a mask. In this case, it is preferable that the thickness S of the first hard mask layer 32 is made larger than the thickness L of the fourth insulating layer 31 by at least 30 nm. For example, if the thickness L of the fourth insulating layer 31 is 120 nm, the thickness S of the first hard mask layer 32 needs to be at least 150 nm.

Next, a description will be given of a specific example of the depth to which the first hard mask layer 32 having the above thickness S is etched down in the step of FIG. 4H. First, the thickness t1 of the second hard mask layer 33 (see FIG. 4B) is about 100 nm taking into consideration of the etching selectivity, etc. If the thickness t1 of the second hard mask layer 33 is 80 nm, and the thickness t3 (see FIG. 4J) is 30 nm, then the range of t2 can be calculated as 25 nm < t2 < 50 nm from the earlier given relation (1). If the thickness S of the first hard mask layer 32 is 150 nm, as described above, the first hard mask layer 32 is etched down to a depth of 100 to 125 nm (S−t2) in the step of FIG. 4H. That is, two-thirds or more of the thickness of the first hard mask layer 32 are removed.

Figure 4L:
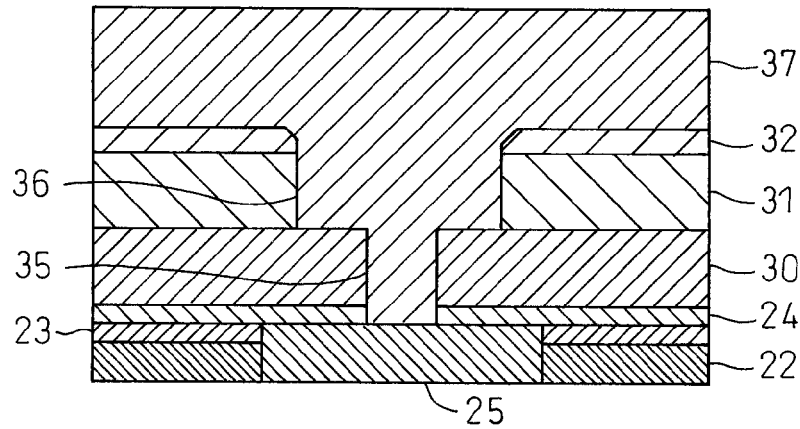

Next, as depicted in FIG. 4L, the conductive material 37 is embedded into the via 35 and interconnect groove 36 in which the barrier metal layer and seed layer have been formed. The conductive material 37 is also deposited over the first hard mask layer 32. For the conductive material 37, for example, copper, aluminum, silver, or the like may be used.

Figure 4M:
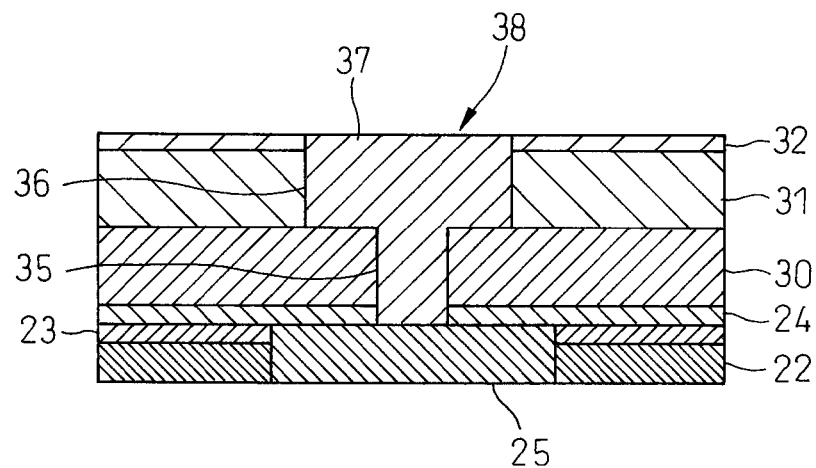

Next, as depicted in FIG. 4M, the excess conductive material 37 is polished by chemical mechanical polishing until the first hard mask layer 32 is exposed, thus completing the formation of the second interconnect layer 38, i.e., the embedded interconnect layer electrically connected to the first interconnect layer 25. In the step of FIG. 4M, the first hard mask layer 32 may be polished halfway through its thickness so as to leave the first hard mask layer 32.

Alternatively, in the step of FIG. 4M, the first hard mask layer 32 may be completely polished away until the fourth insulating layer 31 is exposed.

Figure 4N:
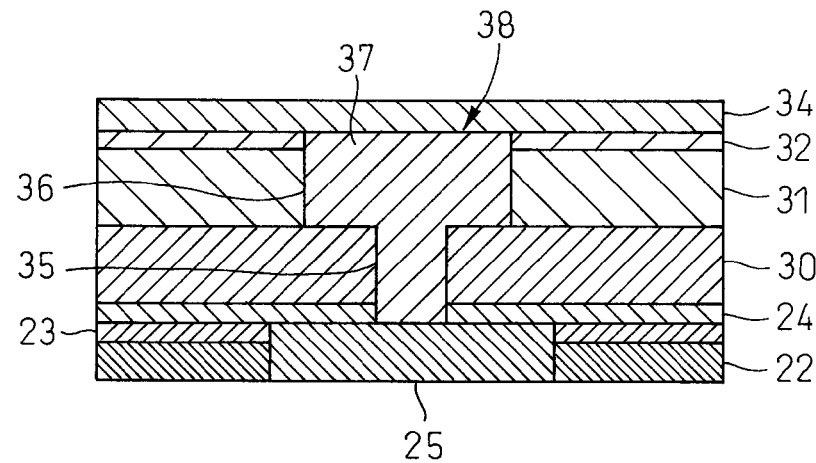

Finally, as depicted in FIG. 4N, the second barrier layer 34 is formed so as to cover the first hard mask layer 32 and the second interconnect layer 38. Other interconnect layers, etc., can be formed as needed on the second barrier layer 34.

Next, a description will be given of why in the step of FIG. 4J, it is preferable from the standpoint of etching selectivity to plasma etch the remaining t2-thickness portion of the first hard mask layer 32 by using a gas containing $CF_4$ and CO.

As earlier described, in the step of FIG. 4K, the interconnect groove is formed by etching the fourth insulating layer 31 using the patterned first hard mask layer 32 as a mask. From the standpoint of forming the interconnect groove with good geometrical accuracy, it is preferable that a predetermined thickness of the second hard mask layer 33 remains on the first hard mask layer 32 during the early stage of the etching.

Therefore, in the step of FIG. 4J, provision has to be made so that, when etching the remaining t2-thickness portion of the first hard mask layer 32, the second hard mask layer 33 acting as the mask will not be completely etched away. For this purpose, it is necessary to use an etching gas that etches the first hard mask layer 32 at a greater rate than the second hard mask layer 33.

When an etching gas having such etching selectivity is used, the thickness t1 of the second hard mask layer 33 to be formed in the step of FIG. 4B can be reduced. Pattern accuracy can be enhanced by etching the first hard mask layer 32 using the thus thinned second hard mask layer 33 as a mask.

A specific example of the above etching selectivity will be described below with reference to FIG. 5 by taking as an example a case in which the first hard mask layer 32 is formed of silicon oxide and the second hard mask layer 33 of silicon nitride.

Figure 5:
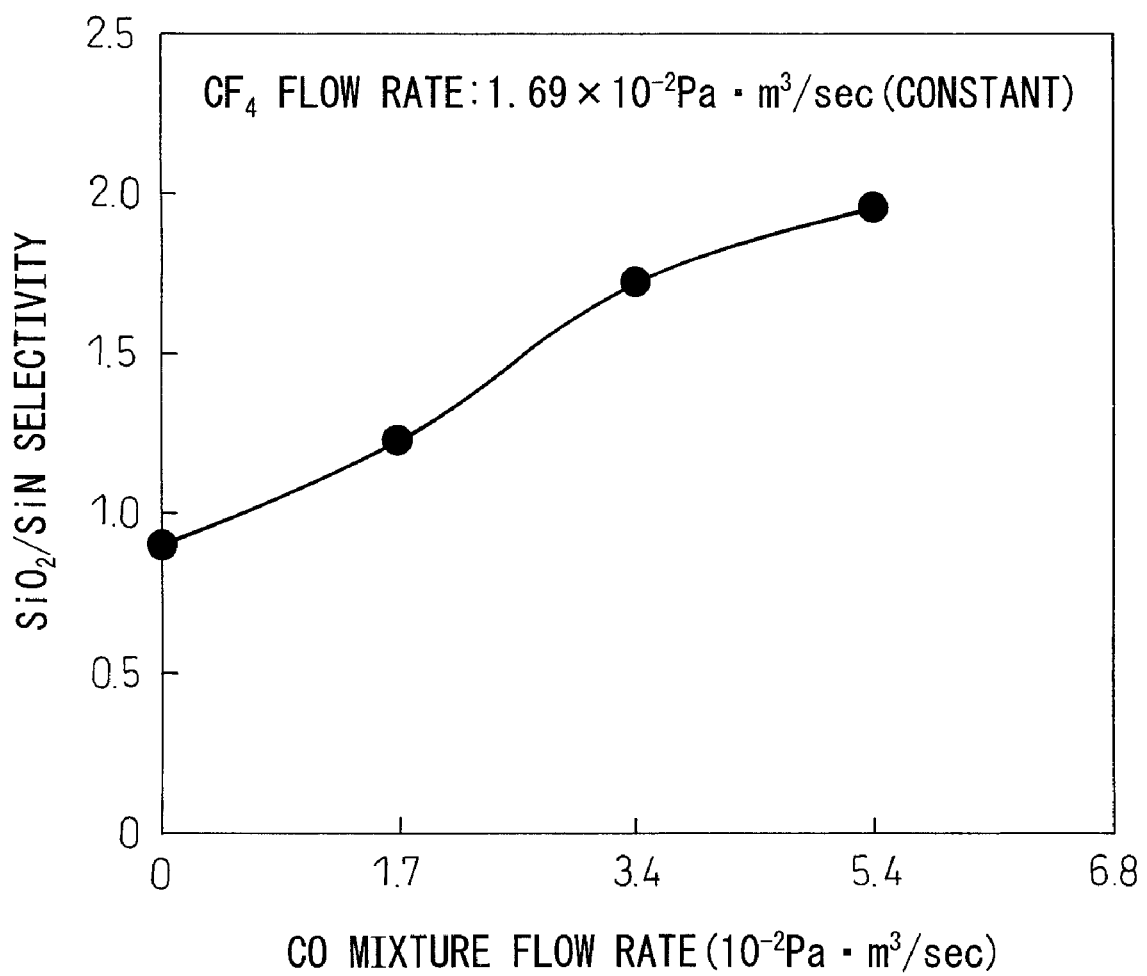
FIG. 5 is a diagram illustrating the relationship between $SiO_2/SiN$ etching selectivity and CO mixture flow rate.

FIG. 5 illustrates the relationship between the ratio of the etching rate of silicon oxide ($SiO_2$) to the etching rate of silicon nitride (SiN) (etching selectivity: $SiO_2$/SiN selectivity) and the flow rate of CO in a mixture of CO and $CF_4$.

As depicted in FIG. 5, when the etching gas is 100% $CF_4$, the etching selectivity is approximately 1, which means that the etching rate is substantially the same for both silicon oxide and silicon nitride.

As the flow rate of CO in the mixture increases while the flow rate of $CF_4$ is maintained constant, the etching rate of silicon oxide becomes greater than the etching rate of silicon nitride, i.e., the etching selectivity increases with increasing CO mixture flow rate.

As the CO mixture flow rate further increases, the proportion of $CF_4$ in the etching gas decreases, and the etching rate of silicon oxide begins to decrease. As a result, the etching selectivity remains constant at about 2.

Accordingly, when the flow rate of the $CF_4$ gas is constant at $1.69\times10^{-2}$ Pa·m$^3$/second, it is preferable to maintain the CO gas mixture flow rate within the range of $3.38\times10^{-2}$ to $5.07\times10^{-2}$ Pa·m$^3$/second from the standpoint of achieving high etching selectivity while maintaining the etching rate of silicon oxide.

Next, a description will be given of why it is preferable that the thickness t1 of the second hard mask layer 33 be within the range of 23 to 90 nm.

The second hard mask layer 33 is etched in the step of FIG. 4J as earlier described. A predetermined thickness of the second hard mask layer 33 acting as a mask has to be left on the first hard mask layer 32 after the etching so that the masked first hard mask layer 31 will not be etched during the etching.

For the predetermined thickness of the second hard mask layer 33 to remain on the first hard mask layer 32 after the etching in the step of FIG. 4J, it is preferable that the thicknesses t1 and t2 satisfy the following relationship (2).

$$t1 = a \times t2/R \quad (2)$$

Parameter "a" is a not smaller than 1, and "a" determines the thickness of the second hard mask layer 33 to be left on the first hard mask layer 32. For example, 1.5 can be used as the value of "a" by considering process variations.

R represents the ratio of the etching rate of the first hard mask layer 32 to the etching rate of the second hard mask layer 33 (etching rate of first hard mask layer 32/etching rate of second hard mask layer 33). The ratio R lies within the range of 1 to 2, as earlier noted.

Then, assuming that the parameter "a" is 1.5 and that the thickness t2 lies within the range of 30 to 60 nm and the ratio R within the range of 1 to 2, the thickness t1 can be calculated as lying within the range of 23 to 90 nm from the above relation (2).

More specifically, when the ratio R is 1, the thickness t1 lies within the range of 45 to 90 nm. When the ratio R is 2, the thickness t1 lies within the range of 23 to 45 nm. The above has described the initial thickness t1 of the second hard mask layer 33.

Next, the relationship (1) will be described.

As described above, it is preferable that the predetermined thickness t3 of the second hard mask layer 33 is left on the first hard mask layer 32 after the etching in the step of FIG. 4J. For this purpose, when the etching rate ratio R (etching rate of first hard mask layer 32/etching rate of second hard mask layer 33) is 1, the thickness t2 is equal to t1−t3. When the etching rate ratio R is 2, the thickness t2 is equal to t1/2−t3/2.

When the etching rate ratio R is within the range of 1 to 2, as described above, the thickness t2 lies within the range of t1/2−t3/2 to t1−t3, hence the relation (1).

Preferred values for the thickness t3 will be described below. As depicted in FIG. 4J, the second hard mask layer 33 is reduced in thickness with its edge shoulder portions near the opening 50 eroded by etching. Considering the erosion of the shoulder portions, it is preferable that the thickest portion of the second hard mask layer 33 retains the thickness t3 of at least 30 nm after the etching, because the interconnect groove can then be formed with good geometrical accuracy in the fourth insulating layer 31 by etching it using the second hard mask layer 33 as a mask. The above describes the relationship (1).

According to the interconnect formation method of the embodiment described above, the first hard mask layer 32 is etched halfway through its thickness in the step of FIG. 4H by using the second resist layer 42 formed on the second hard mask layer 33 as a mask. The first hard mask layer 32 is etched halfway through its thickness while retaining the thickness of the second hard mask layer 33. Then, in the step of FIG. 4J, using this second hard mask layer 33 as a mask, the remaining portion of the first hard mask layer 32 is etched away. As a result, in the step of FIG. 4J, plasma etching can be performed using not only a gas having high etching selectivity, such as $C_4F_6$ or $C_4F_8$, but also a gas having low etching selectivity, for example, $CF_4$; this provides greater freedom in process.

On the other hand, in the case of an etching gas that uses $CH_4F_6/O_2/Ar$ or $CH_4F_8/O_2/Ar$ but does not contain $CF_4$, the etching rate tends to become locally nonuniform in the etching pattern. In the etching process using such a gas, a problem can arise that when processing a plurality of wafers one by one, the etching rate becomes different between the first and the last.

In contrast, according to the interconnect formation method of the present embodiment, since the plasma etching can be performed in the step of FIG. 4J by using a gas containing $CF_4$, the geometrical accuracy of the etching pattern can be enhanced, which serves to enhance process stability.

Figure 1A:
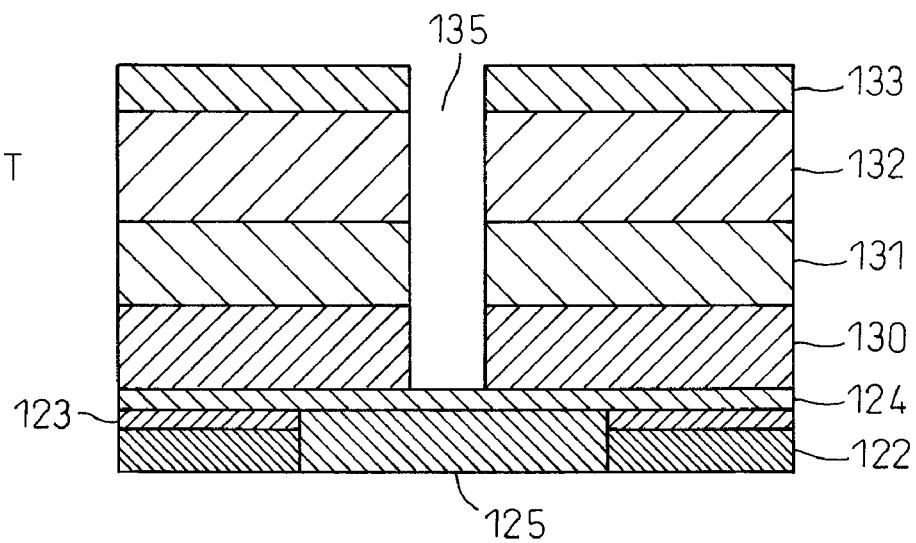
FIGS. 1A to 1I are diagrams illustrating an interconnect formation method according to a related art example.
Figure 1B:
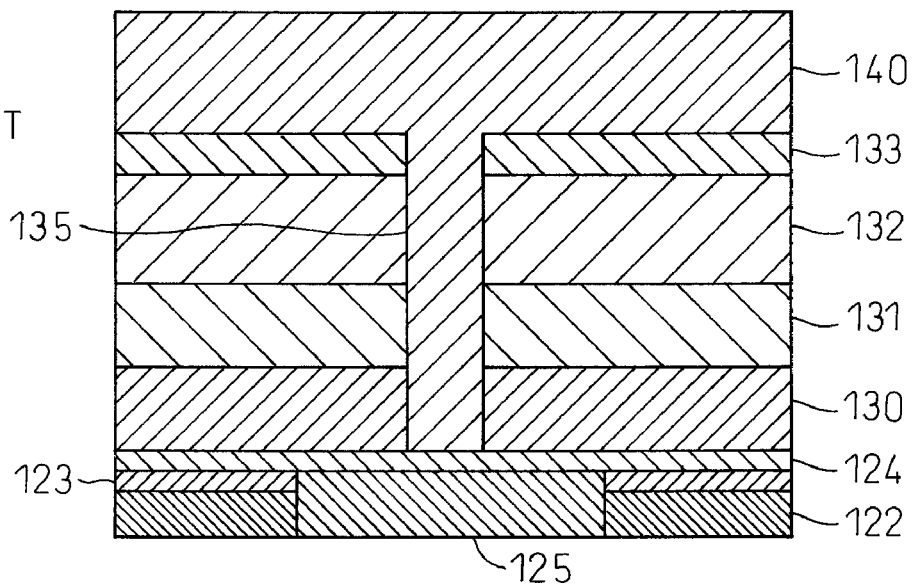
Figure 1C:
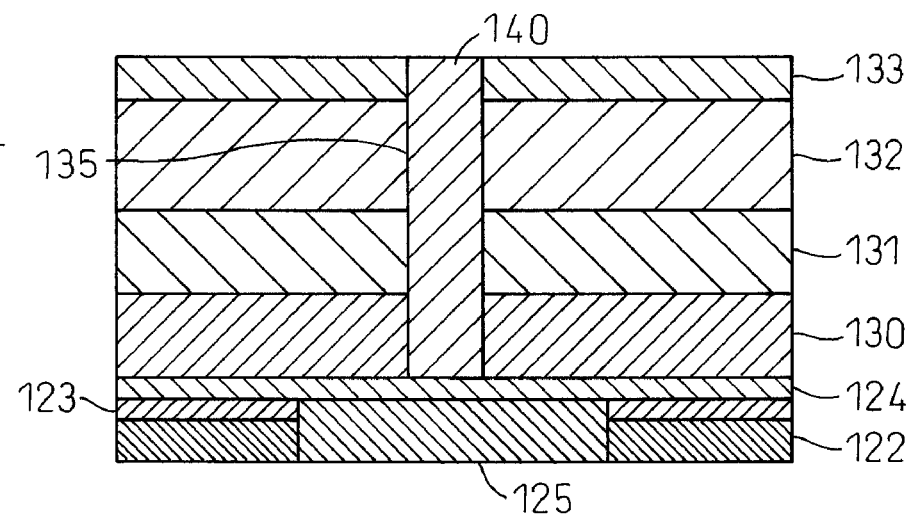
Figure 1D:
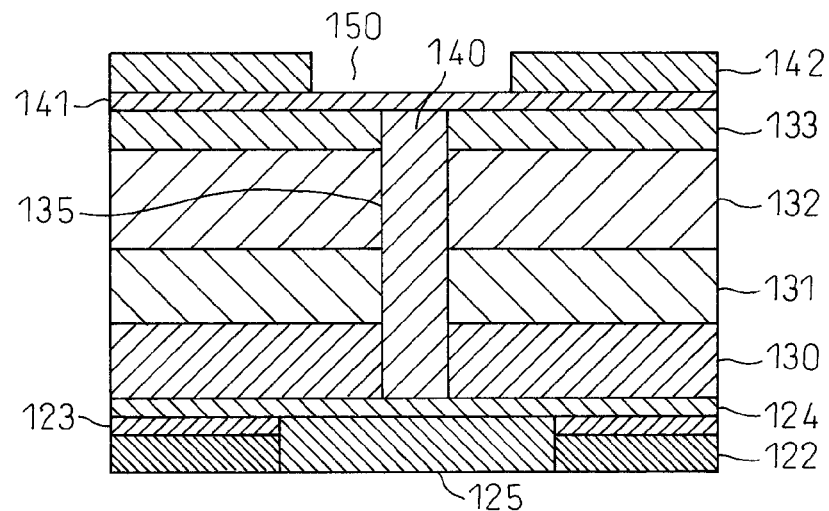
Figure 1E:
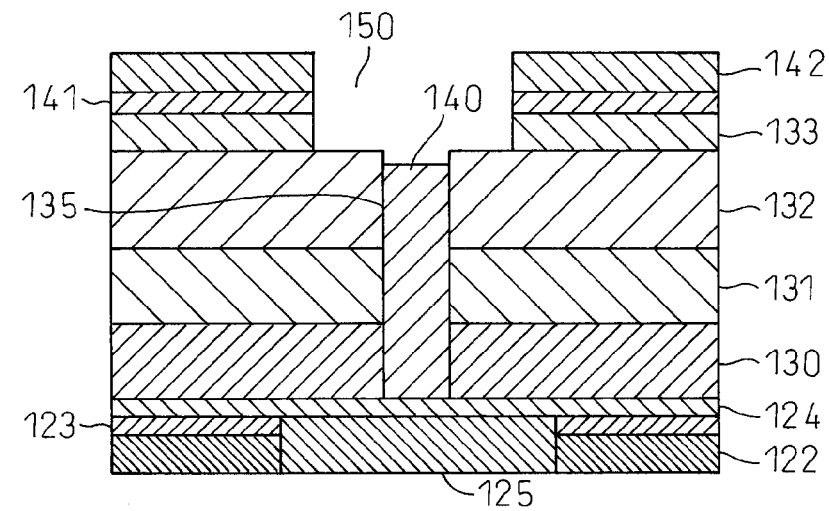
Figure 1F:
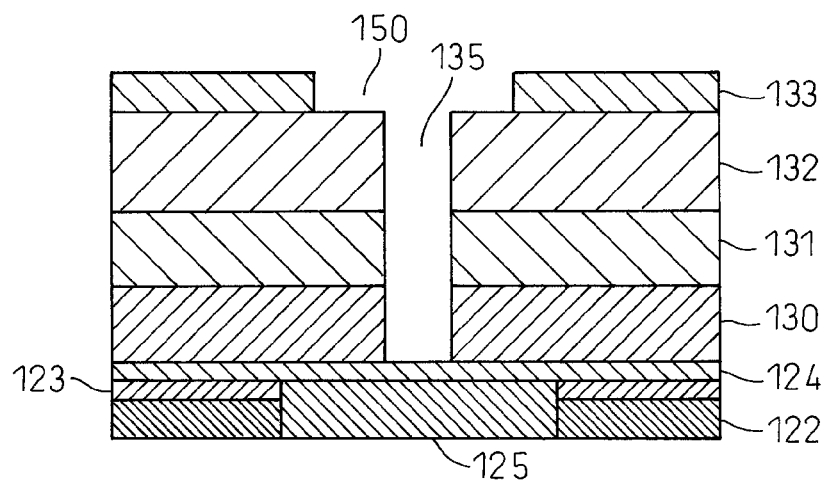
Figure 1G:
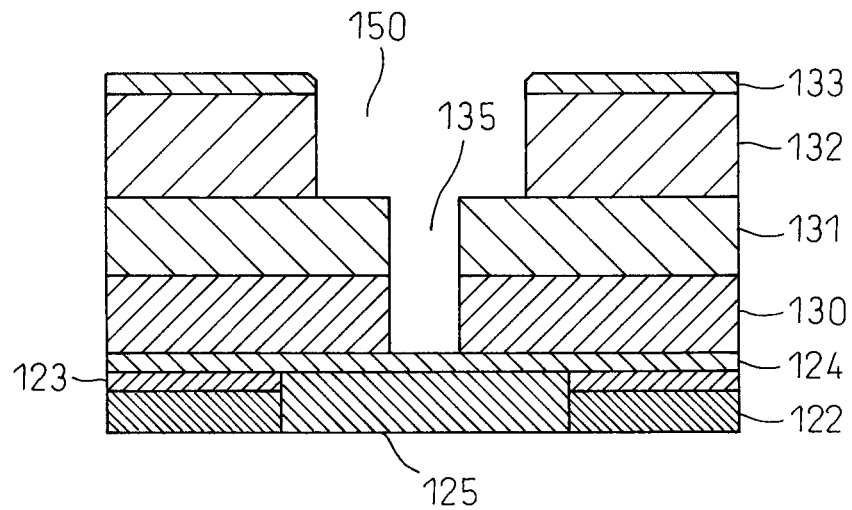
Figure 1H:
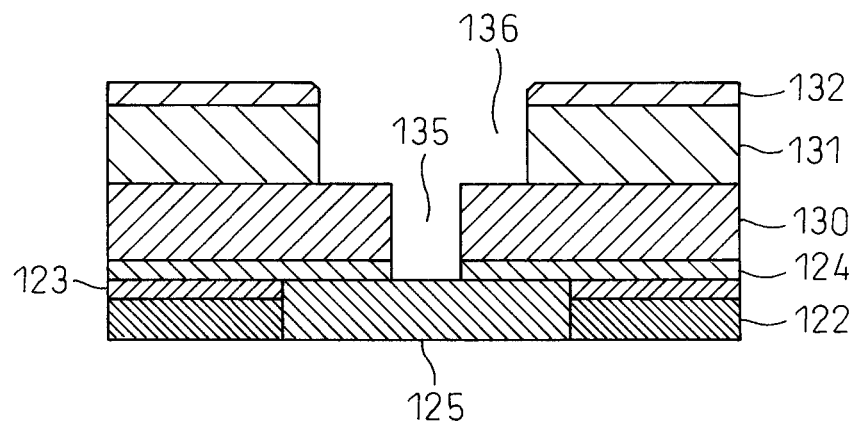
Figure 1I:
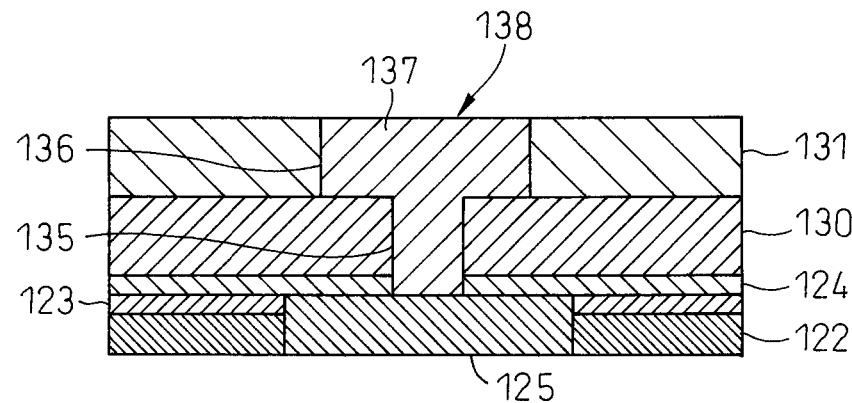
Figure 2A:
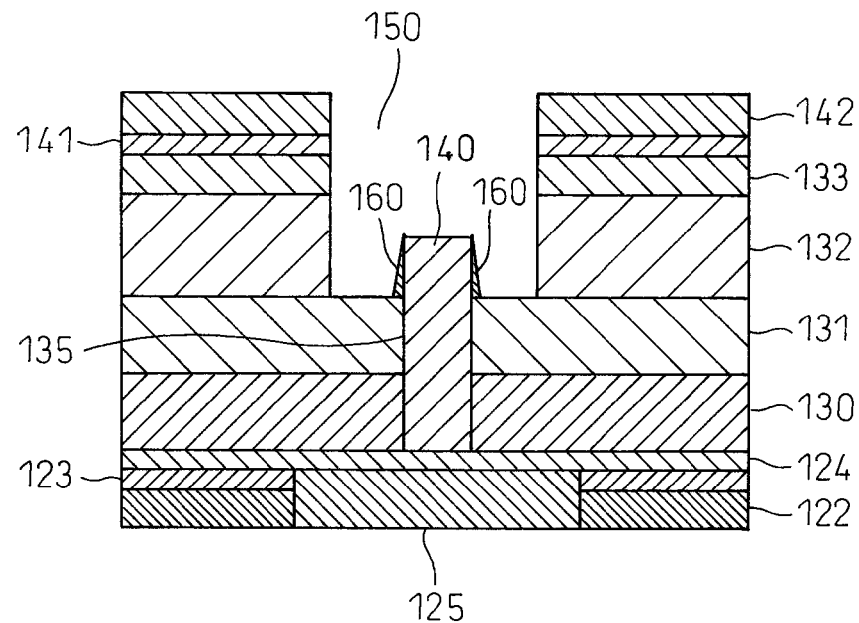
FIGS. 2A and 2B are diagrams illustrating an interconnect formation method according to another related art example.
Figure 2B:
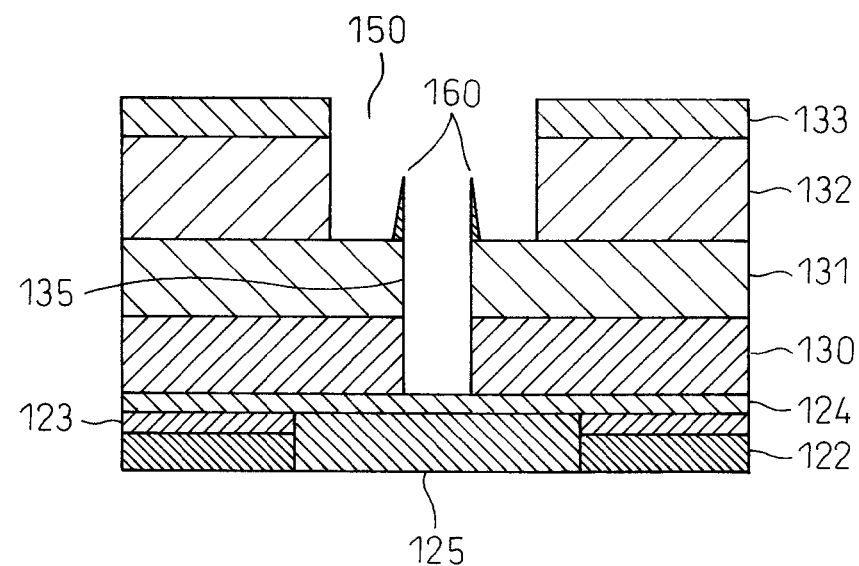

Furthermore, according to the interconnect formation method of the present embodiment, fences such as depicted in FIG. 2B can be prevented from being formed during the step of forming the embedded interconnect layer.

[b] Second Embodiment

Figure 6:
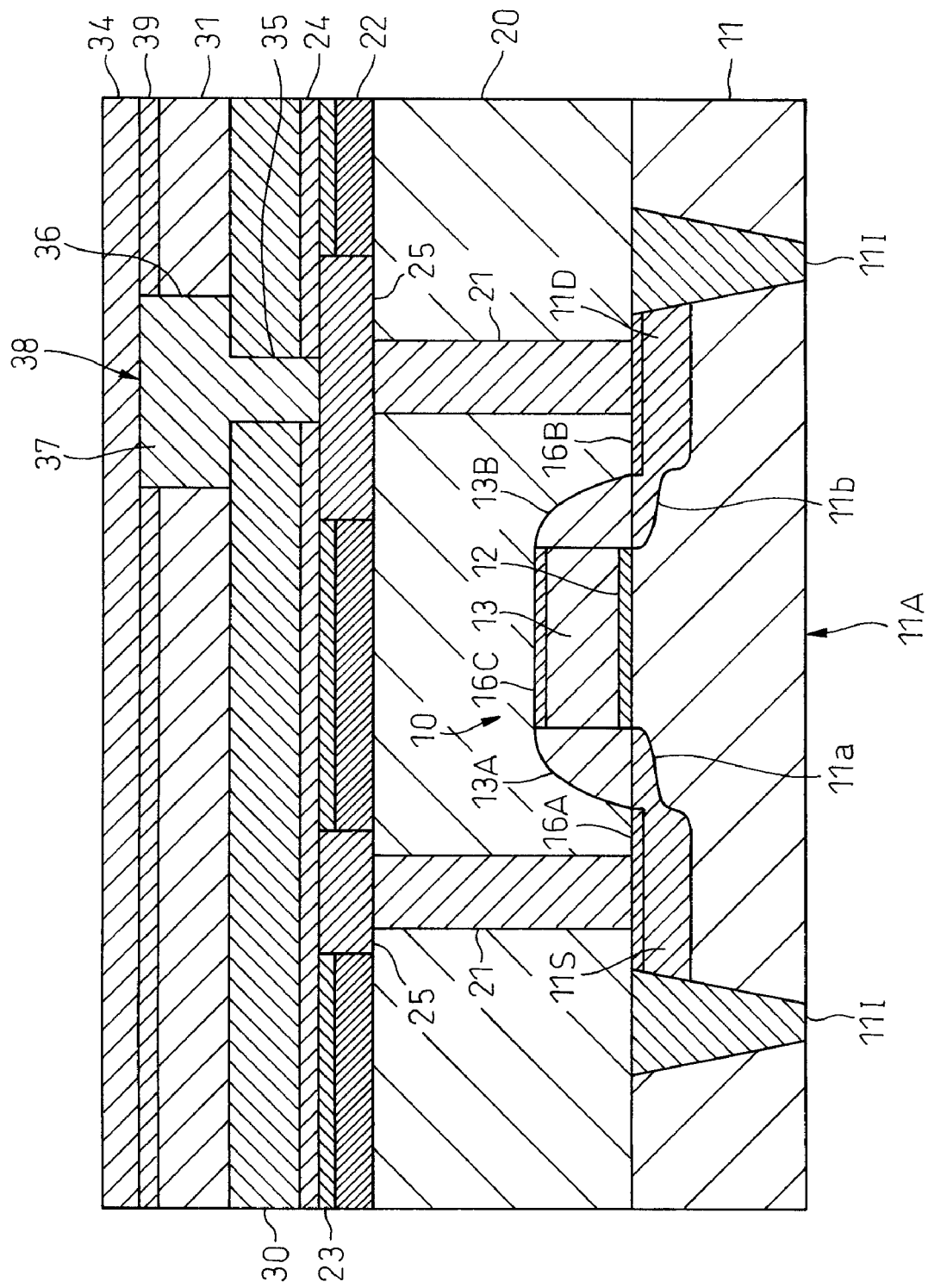
FIG. 6 is a diagram illustrating the structure of a semiconductor device fabricated in accordance with a second embodiment of an interconnect formation method disclosed herein.

Next, an interconnect formation method according to a second embodiment disclosed herein will be described below with reference to the drawings. The second embodiment differs from the first embodiment by the inclusion of a third hard mask layer which is formed under the first hard mask layer of the first embodiment. FIG. 6 is a diagram illustrating a cross-sectional structure of a semiconductor device fabricated in accordance with the second embodiment, and film 39 corresponds to the third hard mask layer.

Figure 7A:
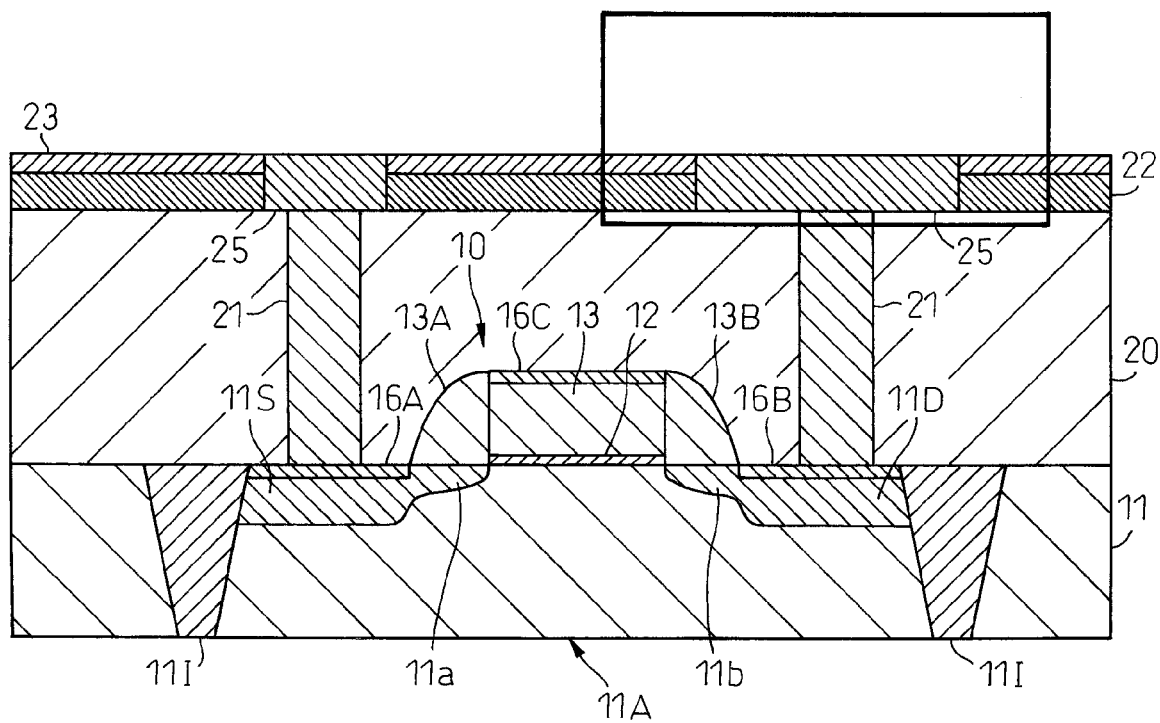
FIGS. 7A to 7O are diagrams depicting fabrication steps according to the second embodiment of the interconnect formation method disclosed herein.

A method of fabricating the structure depicted in FIG. 6 will be described. First, as depicted in FIG. 7A, the structure containing the transistor 10 is formed on the silicon substrate 11. The structure depicted in FIG. 7A further includes the first insulating layer 20, the W plugs 21, the second insulating layer 22, the silicon carbide layer 23, and the first interconnect layer 25. The process for forming an interconnect line in the region enclosed by a rectangular frame in the figure will be described below.

Figure 7B:
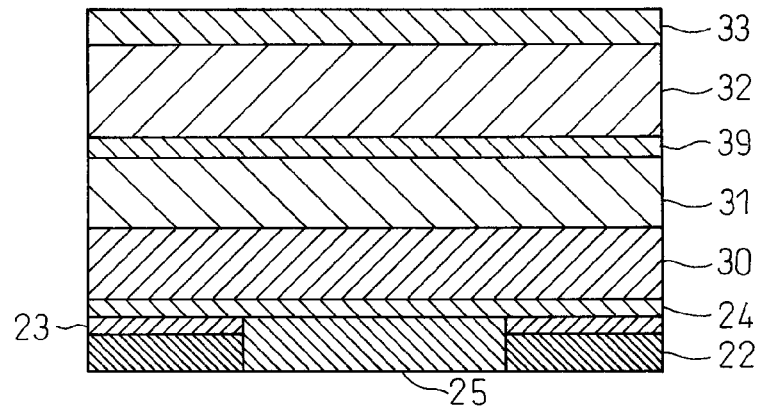

Next, as depicted in FIG. 7B, the first barrier layer 24, the third insulating layer 30, and the fourth insulating layer 31 are formed in sequence one on top of another by plasma CVD on the first interconnect layer 25 which is a conductive layer. Subsequently, the third hard mask layer 39 is formed on the fourth insulating layer 31 by plasma CVD. Further, the first hard mask layer 32 is formed on the third hard mask layer 39 by plasma CVD, and the second hard mask layer 33 is formed on the first hard mask layer 32 by plasma CVD.

The fourth insulating layer 31 formed from a low-k material and the conductive material 37 of copper generally have high chemical mechanical polishing rates and therefore can be easily polished. As a result, when the first hard mask layer 32 is polished by chemical mechanical polishing in the step of FIG. 4M, the polishing may proceed into the fourth insulating layer 31 depending on process variations, etc. In view of this, in the present embodiment, the third hard mask layer 39 which acts as a stopper in the step of removing the first hard mask layer 32 by chemical mechanical polishing is formed between the fourth insulating layer 31 and the first hard mask layer 32 in order to prevent the fourth insulating layer 31 from being polished. It is preferable that the chemical mechanical polishing rate of the first hard mask layer 32 is greater than that of the third hard mask layer 39.

When the first hard mask layer 32 is a silicon oxide film, the third hard mask layer 39 can be formed using, for example, silicon carbide (SiC or SiCH).

The thickness of the third hard mask layer 39 is preferably in the range of 20 to 60 nm, and is chosen, for example, 30 nm. When the thickness of the third hard mask layer 39 is 20 nm or greater, the polishing can be reliably stopped at the third hard mask layer 39. It is preferable to make the thickness of the third hard mask layer 39 not greater than 60 nm, from the standpoint of reducing the time needed to form the third hard mask layer 39.

Figure 7C:
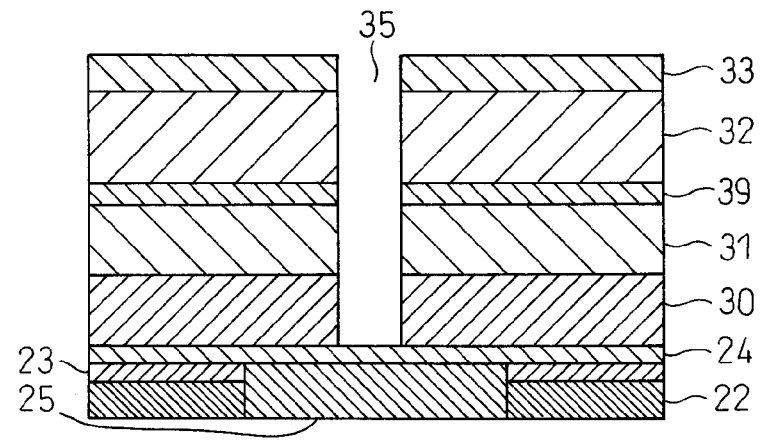

Next, as depicted in FIG. 7C, the via 35 is formed in the region above the first interconnect layer 25 by patterning and etching through the second hard mask layer 33, the first hard mask layer 32, the third hard mask layer 39, the fourth insulating layer 31, and the third insulating layer 30. The first barrier layer 24 is exposed in the bottom of the via 35.

Figure 7D:
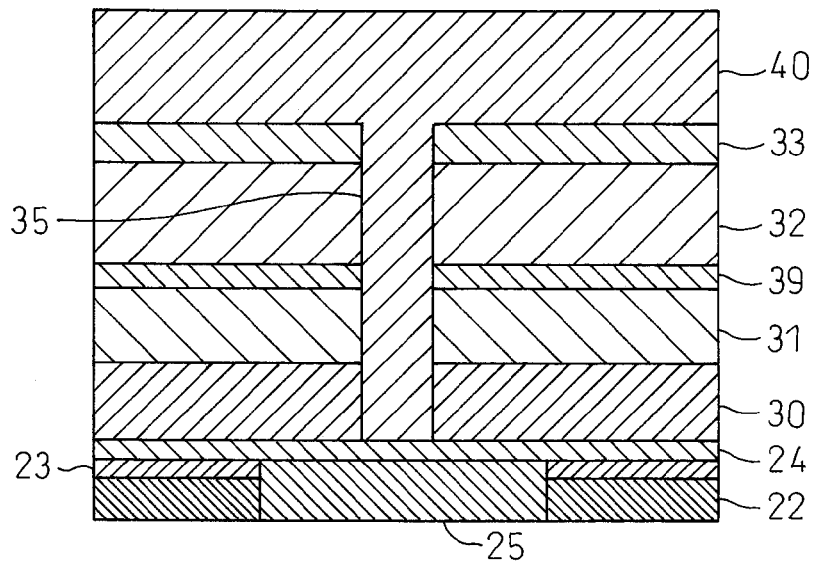

Next, as depicted in FIG. 7D, the first resist layer 40 is formed in such a manner as to fill the via 35 and to cover the second hard mask layer 33.

Figure 7E:
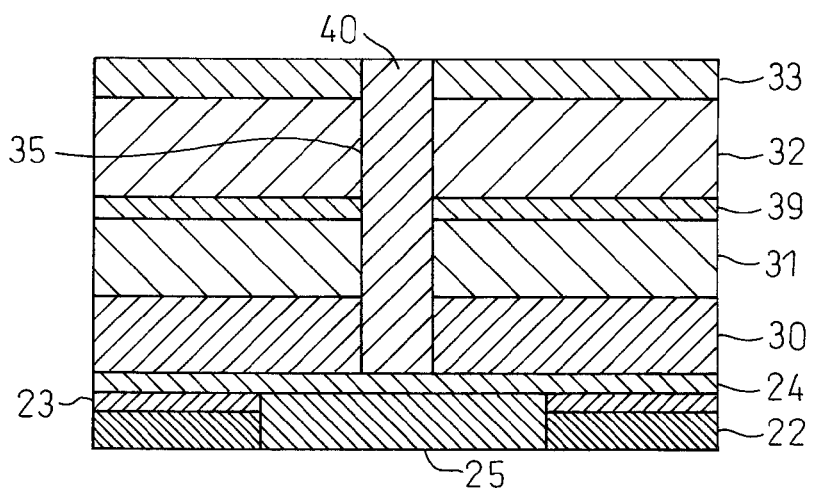

Next, as depicted in FIG. 7E, the first resist layer 40 is etched back until the second hard mask layer 33 is exposed, and the upper surface of the first resist layer 40 is planarized so that it becomes coplanar with the upper surface of the second hard mask layer 33.

Figure 7F:
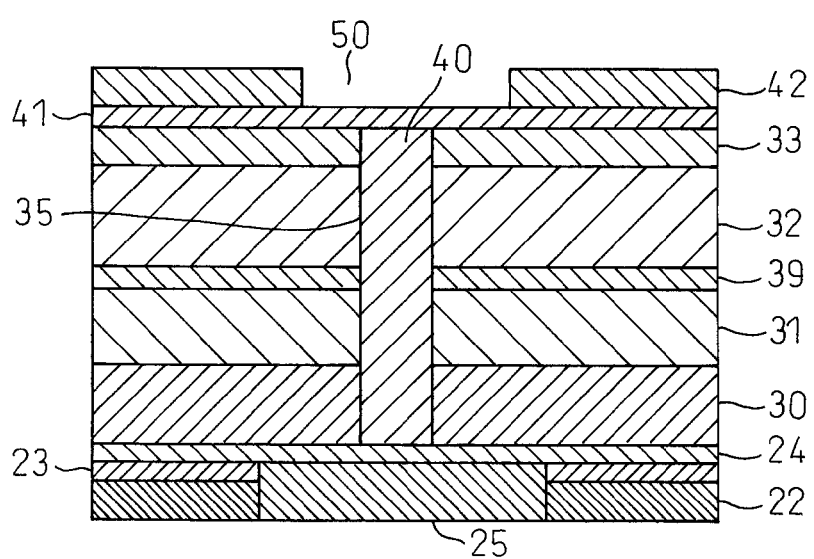

Next, as depicted in FIG. 7F, the BARC layer 41 and the second resist layer 42 are formed on top of the second hard mask layer 33. Subsequently, the opening 50 for forming the interconnect groove is formed by patterning the second resist layer 42 in such a manner to be aligned with the via 35. The patterned second resist layer 42 contains an interconnect pattern that matches the embedded interconnect layer 38.

Figure 7G:
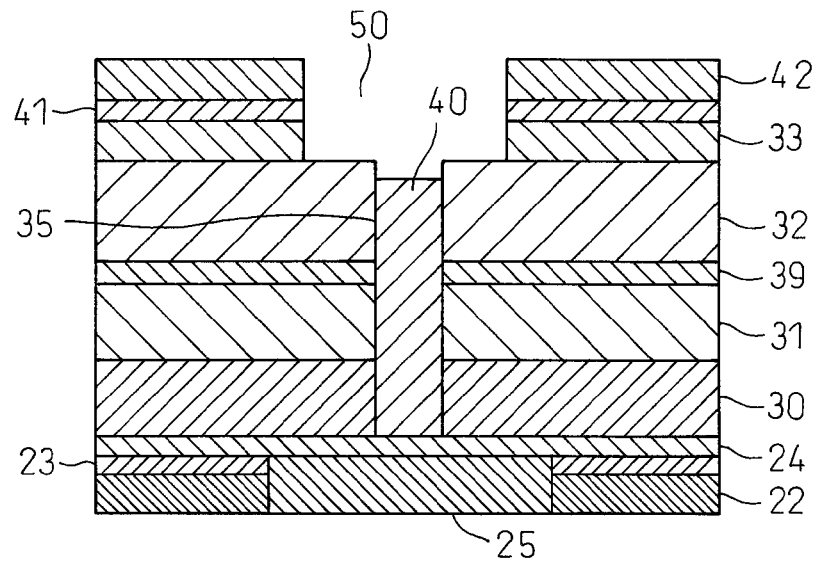

Next, as depicted in FIG. 7G, using the patterned second resist layer 42 as a mask, the BARC layer 41 is etched until the second hard mask layer 33 is exposed, thus patterning the BARC layer 41 and increasing the depth of the opening 50.

Subsequently, using the patterned second resist layer 42 and BARC layer 41 as a mask, the second hard mask layer 33 is etched until the first hard mask layer 32 is exposed, thus patterning the second hard mask layer 33.

Figure 7H:
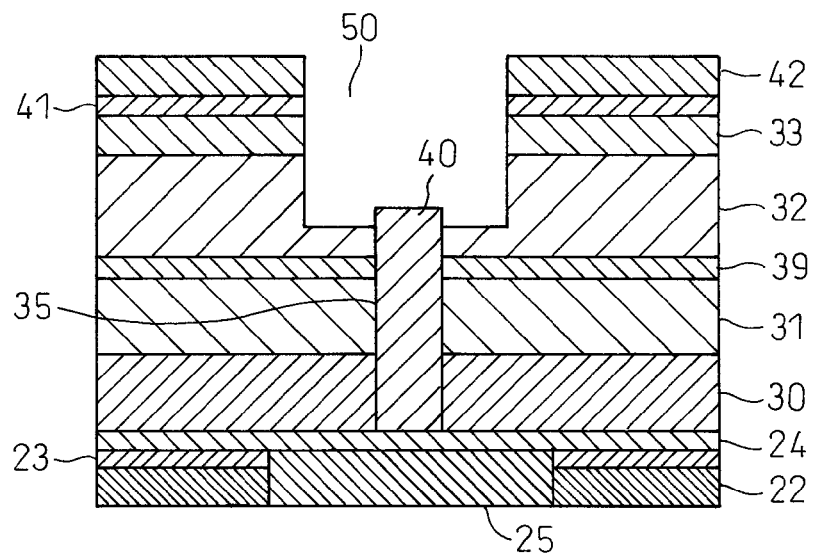

Next, as depicted in FIG. 7H, using the patterned second resist layer 42, BARC layer 41, and second hard mask layer 33 as a mask, the first hard mask layer 32 is etched halfway through its thickness.

Since the first hard mask layer 32 is etched only halfway through its thickness in the step of FIG. 7H, the amount of the first resist layer 40 protruding into the opening 50 is small, as depicted in FIG. 7H.

Figure 7I:
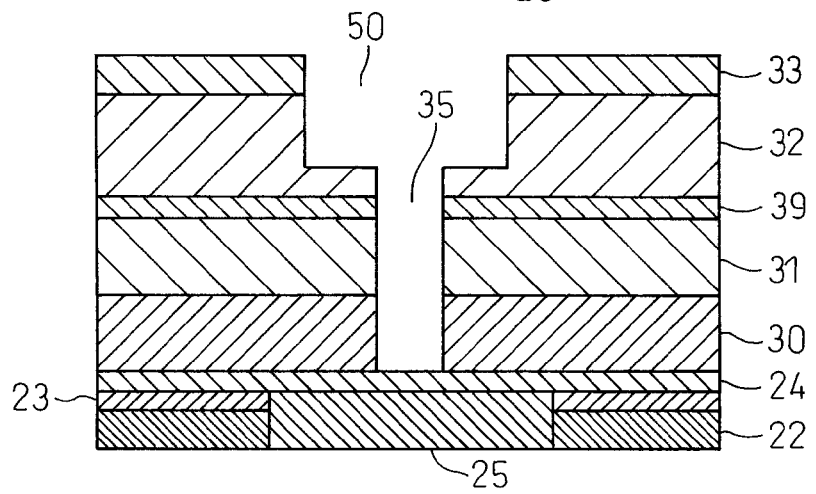

Next, as depicted in FIG. 7I, the second resist layer 42, the BARC layer 41, and the first resist layer 40 embedded in the via 35 are removed by ashing.

Since the first resist layer 40 protruding by a small amount into the opening 50 is removed by ashing in the step of FIG. 7I, it is possible to prevent fences from being formed inside the opening 50.

Figure 7J:
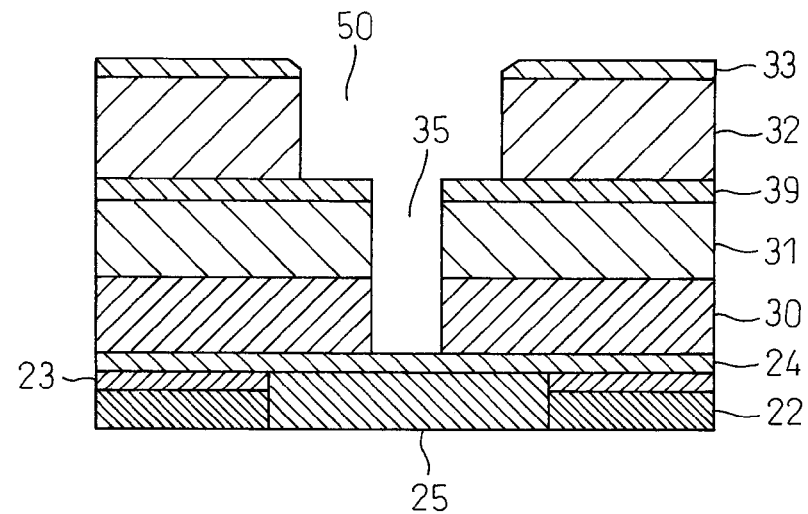

Next, as depicted in FIG. 7J, using the patterned second hard mask layer 33 as a mask, the first hard mask layer 32 is etched to remove all of the remaining thickness portion, thus patterning the first hard mask layer 32.

Figure 7K:
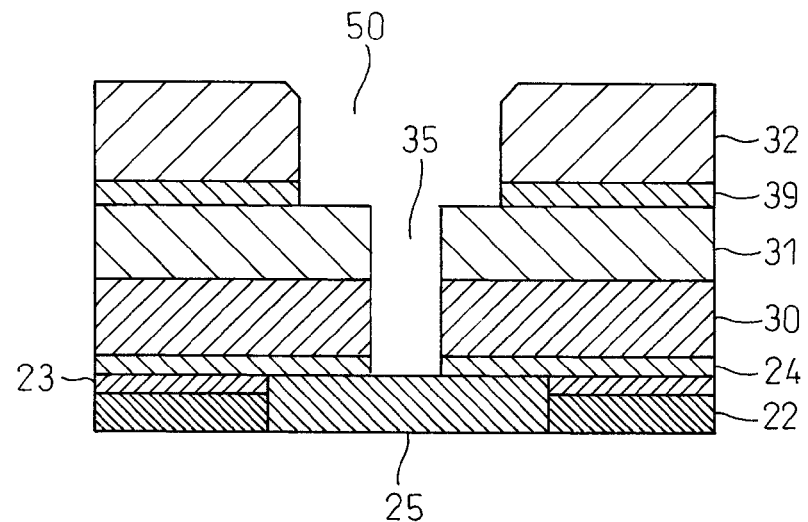

Next, as depicted in FIG. 7K, using the patterned second hard mask layer 33 and first hard mask layer 32 as a mask, the portion of the third hard mask layer 39 that is exposed in the opening 50 is removed by etching. As a result, the fourth insulating layer 31 is exposed in the opening 50. The third hard mask layer 39 is etched by means of plasma etching using, for example, a gas containing $CF_4$. Further, with this etching, the second hard mask 33 is removed, and the portion of the first barrier layer 24 that is exposed in the via 35 is also removed, exposing the first interconnect layer 25 in the via 35.

Figure 7L:
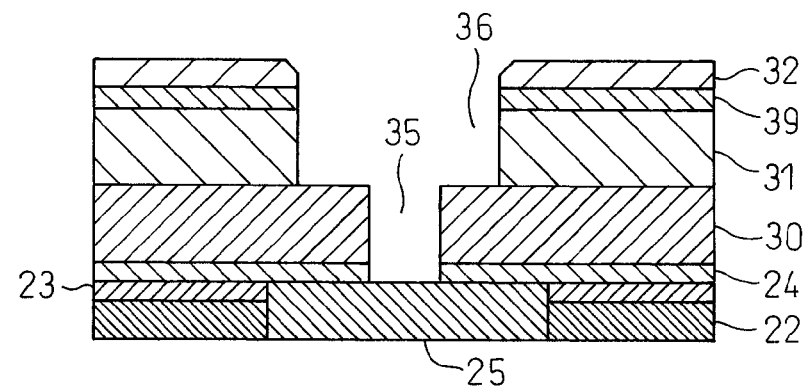

Next, as depicted in FIG. 7L, using the patterned first hard mask layer 32 and third hard mask layer 39 as a mask, the fourth insulating layer 31 is etched until the third insulating layer 30 is exposed, thus forming the interconnect groove 36. Then, after wet cleaning the interconnect structure depicted in FIG. 7L, a barrier metal layer and seed layer (not shown) are formed on the inner walls of the via 35 and interconnect groove 36. The seed layer can be formed using, for example, copper.

Figure 7M:
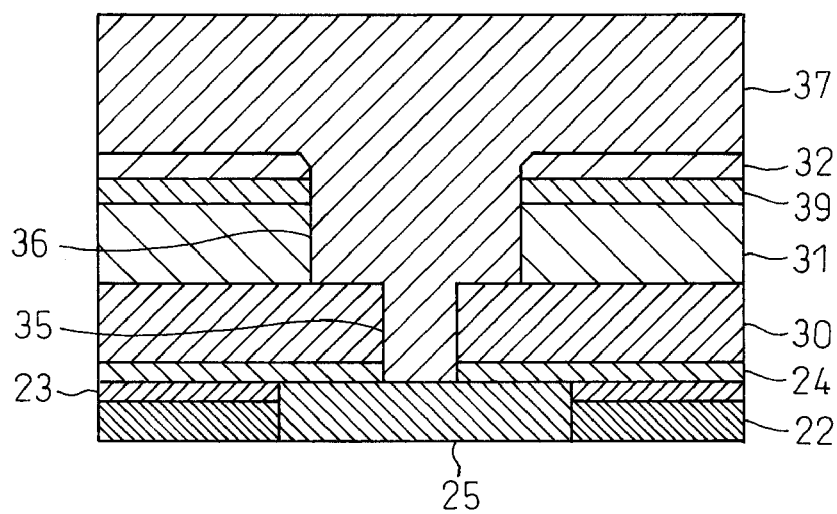

Next, as depicted in FIG. 7M, the conductive material 37 is embedded into the via 35 and interconnect groove 36 in which the barrier metal layer and the seed layer have been formed. The conductive material 37 is also deposited over the first hard mask layer 32. For the conductive material 37, for example, copper, aluminum, silver, or the like may be used.

Figure 7N:
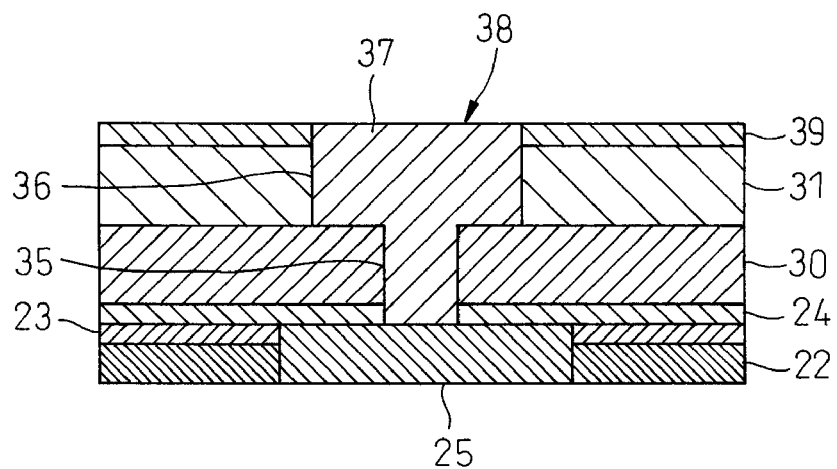

Next, as depicted in FIG. 7N, the excess conductive material 37 and the first hard mask layer 32 are polished by chemical mechanical polishing until the third hard mask layer 39 is exposed, thus completing the formation of the second interconnect layer 38, i.e., the embedded interconnect layer electrically connected to the first interconnect layer 25.

Figure 7O:
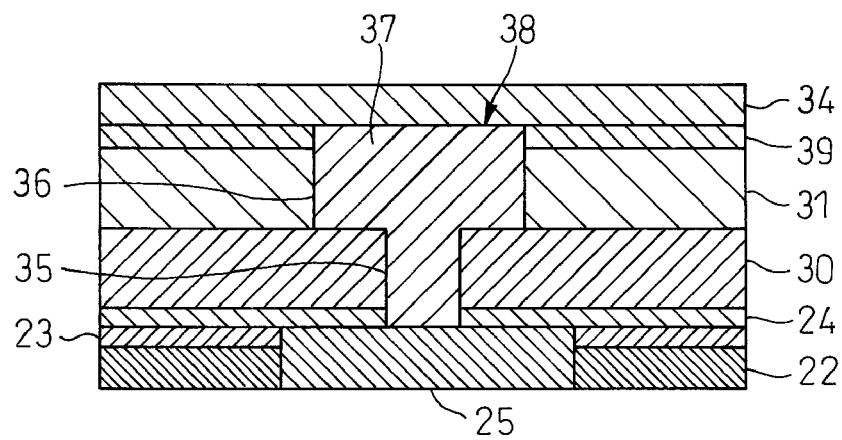

Finally, as depicted in FIG. 7O, the second barrier layer 34 is formed so as to cover the third hard mask layer 39 and the second interconnect layer 38. Other interconnect layers, etc., can be formed as needed on the second barrier layer 34.

According to the interconnect formation method of the embodiment described above, since the third hard mask layer 39 having a lower chemical mechanical polishing rate than the first hard mask layer 32 is formed on the fourth insulating layer 31, it becomes possible to prevent the fourth insulating layer 31 from being polished in the step of FIG. 7N.

The interconnect formation method of the embodiment described above further offers the effect of providing greater freedom in process and enhancing process stability, as in the foregoing first embodiment.

According to the present invention, the interconnect formation method of each of the above embodiments can be suitably modified without departing from the spirit and scope of the invention. For example, in each of the above embodiments, the insulating layer has been formed from two layers, i.e., the third insulating layer 30 and the fourth insulating layer 31, but the insulating layer may be formed from a single layer.

Further, in each of the above embodiments, each layer has been formed by plasma CVD, but each layer may be formed using other deposition techniques, such as pyrolytic CVD and sputtering.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device comprising:
   forming an insulating layer over an electrically conductive layer;
   forming a first mask layer over said insulating layer;
   forming a second mask layer over said first mask layer;
   forming a via which passes through said second mask layer, said first mask layer, and said insulating layer;
   forming a first resist layer in such a manner as to fill said via;
   forming a second resist layer over said second mask layer and said first resist layer;
   patterning said second resist layer into an interconnect pattern;
   etching said second mask layer by using said patterned second resist layer as a mask;
   etching said first mask layer halfway through a thickness thereof by using said second resist layer and said second mask layer as a mask;
   removing said first resist layer and said second resist layer;
   etching away a remaining portion of said first mask layer by using said second mask layer as a mask;
   forming an interconnect groove by etching said insulating layer using said first mask layer as a mask; and
   forming an electrically conductive material into said via and said interconnect groove, thereby forming an interconnect layer connected to said electrically conductive layer.

2. The method according to claim 1, wherein said first mask layer contains silicon oxide.

3. The method according to claim 2, wherein said second mask layer includes at least one selected from the group consisting of silicon nitride and silicon carbide.

4. The method according to claim 1, wherein a gas including $CF_4$ is used in at least one of said etching said first mask layer halfway through the thickness thereof and said etching away the remaining portion of said first mask layer.

5. The method according to claim 1, wherein a gas including $CF_4$ and CO is used in said etching away the remaining portion of said first mask layer.

6. The method according to claim 4, wherein said gas including $CF_4$ and at least one kind of gas selected from the group consisting of $C_4F_6$, $C_4F_8$, $CHF_3$, $CH_2F_2$, $H_2$, $N_2$, $O_2$, and Ar is used in at least one of said etching said first mask layer halfway through the thickness thereof and said etching away the remaining portion of said first mask layer.

7. The method according to claim 1, further comprising forming a third mask layer before said forming said first mask layer, and wherein
   in forming said first mask layer, said first mask layer is formed over said third mask layer.

8. The method according to claim 7, wherein said forming said electrically conductive material into said via and said interconnect groove includes:
   depositing said electrically conductive material over said first mask as well as into said via and said interconnect groove; and removing said electrically conductive material lying over said first mask by chemical mechanical polishing, wherein said first mask layer has a greater chemical mechanical polishing rate than chemical mechanical polishing rate of said third mask layer.

9. The method according to claim 7, wherein said third mask layer includes silicon carbide.

10. The method according to claim 9, wherein said insulating layer includes a first insulating layer formed over said electrically conductive layer and a second insulating layer formed over said first insulating layer, and wherein said second insulating layer has a lower dielectric constant than dielectric constant of said first insulating layer.

11. The method according to claim 1, wherein said forming said second mask layer includes forming said second mask layer to a thickness t1, said etching said first mask layer halfway through the thickness thereof includes etching said first mask layer until the thickness of said first mask layer is reduced to t2, and said etching away the remaining portion of said first mask layer includes etching said second mask layer until the thickness of said second mask layer is reduced to t3, and wherein t1, t2, and t3 satisfy the relation $t1/2 - t3/2 < t2 < t1 - t3$.

12. The method according to claim 1, wherein said forming said second mask layer includes forming said second mask layer to a thickness falling within a range of 23 nm to 90 nm, and said etching said first mask layer halfway through the thickness thereof includes etching said first mask layer until the thickness of said first mask layer is reduced to within a range of 30 nm to 60 nm.

13. The method according to claim 1, wherein a $CF_4$ gas with a flow rate of $1.69 \times 10^{-2}$ Pa·m³/second and a CO gas with a flow rate of $3.38 \times 10^{-2}$ to $5.07 \times 10^{-2}$ Pa·m³/second are used in said etching away the remaining portion of said first mask layer.

* * * * *